United States Patent
Kim et al.

(10) Patent No.: US 11,870,025 B2
(45) Date of Patent: *Jan. 9, 2024

(54) DISPLAY DEVICE

(71) Applicant: SAMSUNG DISPLAY CO., LTD., Yongin-si (KR)

(72) Inventors: Jin Taek Kim, Yongin-si (KR); Seung Min Lee, Hwaseong-si (KR); Jung Hwan Yi, Seoul (KR); Hee Keun Lee, Suwon-si (KR); Bek Hyun Lim, Hwaseong-si (KR); Kyung Tae Chae, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/839,200

(22) Filed: Jun. 13, 2022

(65) Prior Publication Data

US 2022/0310895 A1    Sep. 29, 2022

Related U.S. Application Data

(63) Continuation of application No. 17/079,181, filed on Oct. 23, 2020, now Pat. No. 11,362,250.

(30) Foreign Application Priority Data

Apr. 3, 2020 (KR) .................. 10-2020-0040855

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 27/1259* (2013.01);
(Continued)

(58) Field of Classification Search
CPC . H01L 33/62; H01L 25/0753; H01L 27/1259; H01L 29/78633;
(Continued)

(56) References Cited

U.S. PATENT DOCUMENTS 11,362,250 B2 * 6/2022 Kim .................... H01L 27/1259
11,423,827 B2 * 8/2022 Kim .................... G09G 3/32
(Continued)

FOREIGN PATENT DOCUMENTS

EP    3 316 301 A1    5/2018
EP    3 828 930 A2    6/2021
(Continued)

OTHER PUBLICATIONS

European Search Report Corresponding to EP Application No. 21164775.5-1211, dated Aug. 19, 2021, 6 pages.

*Primary Examiner* — Victor A Mandala
(74) *Attorney, Agent, or Firm* — Lewis Roca Rothgerber Christie LLP

(57) ABSTRACT

A display device includes a first substrate, a wire pad in a pad area, first banks in a display area, electrodes on the first banks, a pad electrode base layer on the wire pad, having a greater width than the wire pad, and covering sides of the wire pad, a first insulating layer covering parts of the electrodes and part of the pad electrode base layer, light-emitting elements on the first insulating layer in the display area, respective ends of the light-emitting elements being on different electrodes, contact electrodes on the electrodes and contacting first ends of the light-emitting elements, and a pad electrode upper layer on the first insulating layer in the pad area and directly contacting the pad electrode base layer, wherein the pad electrode base layer includes the same material as the electrodes, and the pad electrode upper layer includes the same material as the contact electrodes.

15 Claims, 26 Drawing Sheets

(51) Int. Cl.
*H01L 27/12* (2006.01)
*H01L 29/786* (2006.01)
*G09G 3/32* (2016.01)

(52) U.S. Cl.
CPC ......... *H01L 29/78633* (2013.01); *G09G 3/32* (2013.01); *G09G 2300/0426* (2013.01); *G09G 2300/0439* (2013.01); *G09G 2300/08* (2013.01); *G09G 2310/0267* (2013.01); *H01L 2933/0066* (2013.01)

(58) Field of Classification Search
CPC ... H01L 2933/0066; H01L 33/44; G09G 3/32; G09G 2300/0426; G09G 2300/0439; G09G 2300/08; G09G 2310/0267; G02F 1/1347; G02F 1/133603; G02F 1/1343

See application file for complete search history.

(56) References Cited

U.S. PATENT DOCUMENTS

| | | | |
|---|---|---|---|
| 11,424,288 B2* | 8/2022 | Chai | H01L 27/1255 |
| 2018/0019369 A1* | 1/2018 | Cho | H05K 1/11 |
| 2018/0019377 A1* | 1/2018 | Kim | H01L 33/44 |
| 2018/0019426 A1* | 1/2018 | Im | H01L 25/0753 |
| 2018/0175106 A1* | 6/2018 | Kim | H01L 33/385 |
| 2019/0115513 A1* | 4/2019 | Im | H01L 33/06 |
| 2019/0244567 A1* | 8/2019 | Cho | H05B 45/40 |
| 2019/0244985 A1* | 8/2019 | Kim | H01L 27/124 |
| 2019/0251898 A1* | 8/2019 | Cho | H01L 27/156 |
| 2019/0319168 A1* | 10/2019 | Kim | H10K 59/124 |
| 2020/0005703 A1* | 1/2020 | Kim | G09G 3/32 |
| 2020/0013766 A1* | 1/2020 | Kim | H01L 25/167 |
| 2020/0075667 A1 | 3/2020 | Lee et al. | |
| 2020/0075814 A1* | 3/2020 | Park | H01L 25/0753 |
| 2020/0135089 A1* | 4/2020 | Ji | H01L 33/62 |
| 2020/0144453 A1* | 5/2020 | Chang | H01L 27/156 |
| 2020/0152835 A1* | 5/2020 | Ko | G09G 3/3233 |
| 2020/0168662 A1* | 5/2020 | Kim | H01L 25/0753 |
| 2020/0203587 A1* | 6/2020 | Kim | H01L 27/156 |
| 2020/0258938 A1* | 8/2020 | Chai | H01L 27/1244 |
| 2020/0273397 A1* | 8/2020 | Jeong | G09G 3/32 |
| 2020/0273906 A1* | 8/2020 | Li | H01L 27/156 |
| 2020/0403029 A1* | 12/2020 | Kim | H01L 27/156 |
| 2021/0167050 A1* | 6/2021 | Cho | H01L 25/0753 |
| 2021/0167124 A1* | 6/2021 | Min | H01L 33/0062 |
| 2021/0167253 A1* | 6/2021 | Basrur | H01L 27/156 |
| 2021/0202450 A1* | 7/2021 | Min | H01L 33/0093 |
| 2021/0202451 A1* | 7/2021 | Kong | H01L 33/0095 |
| 2021/0202800 A1* | 7/2021 | Jung | H01L 27/1214 |
| 2021/0217739 A1* | 7/2021 | Lee | H01L 33/50 |
| 2021/0225993 A1* | 7/2021 | Im | H01L 33/62 |
| 2021/0242380 A1* | 8/2021 | Kim | H01L 25/0753 |
| 2021/0265324 A1* | 8/2021 | Kong | H10K 59/131 |
| 2021/0272937 A1* | 9/2021 | Lim | H01L 25/0753 |
| 2021/0273131 A1* | 9/2021 | Kang | H01L 24/95 |
| 2021/0273142 A1* | 9/2021 | Kang | H01L 33/62 |
| 2021/0280753 A1* | 9/2021 | Kim | H01L 33/54 |
| 2021/0288033 A1* | 9/2021 | Lim | H01L 33/08 |
| 2021/0288217 A1* | 9/2021 | Li | H01L 25/167 |
| 2021/0288220 A1* | 9/2021 | Oh | H01L 25/0753 |
| 2021/0296538 A1* | 9/2021 | Li | H01L 33/382 |
| 2021/0296550 A1* | 9/2021 | Li | H01L 33/38 |
| 2021/0305222 A1* | 9/2021 | Min | H01L 33/405 |
| 2021/0327954 A1* | 10/2021 | Cho | H01L 33/62 |
| 2021/0343783 A1* | 11/2021 | Choi | H01L 33/38 |
| 2021/0343784 A1* | 11/2021 | Kwag | H01L 29/78633 |
| 2021/0351171 A1* | 11/2021 | Yoo | H01L 27/1214 |
| 2021/0358393 A1* | 11/2021 | Kang | H01L 33/62 |
| 2021/0359165 A1* | 11/2021 | Im | H01L 33/62 |
| 2021/0359166 A1* | 11/2021 | Jung | H01L 33/005 |
| 2021/0375194 A1* | 12/2021 | Kwag | G09G 3/32 |
| 2021/0384252 A1* | 12/2021 | Lee | H01L 29/7869 |
| 2021/0391380 A1* | 12/2021 | Li | H01L 33/62 |
| 2021/0398956 A1* | 12/2021 | Jung | C09D 11/322 |
| 2021/0399040 A1* | 12/2021 | Chai | H01L 33/38 |
| 2021/0408108 A1* | 12/2021 | Kwag | H01L 33/18 |
| 2022/0005979 A1* | 1/2022 | Kang | H01L 27/156 |
| 2022/0013693 A1* | 1/2022 | Cho | H01L 33/24 |
| 2022/0028923 A1* | 1/2022 | Li | H01L 33/24 |
| 2022/0102458 A1* | 3/2022 | Kim | H10K 71/00 |
| 2022/0102604 A1* | 3/2022 | Do | H01L 24/95 |

FOREIGN PATENT DOCUMENTS

| | | |
|---|---|---|
| KR | 10-2018-0066945 A | 6/2018 |
| KR | 10-2018-0071465 A | 6/2018 |
| KR | 10-2018-0077742 A | 7/2018 |
| KR | 10-2020-0001657 A | 1/2020 |
| WO | WO 2020/009274 A1 | 1/2020 |

\* cited by examiner

DISPLAY DEVICE

CROSS-REFERENCE TO RELATED APPLICATIONS

This application is a continuation of U.S. patent application Ser. No. 17/079,181, filed Oct. 23, 2020, which claims priority to and the benefit of Korean Patent Application No. 10-2020-0040855, filed Apr. 3, 2020, the entire content of both of which is incorporated herein by reference.

BACKGROUND

1. Field

The present disclosure relates to a display device.

2. Description of the Related Art

Display devices have increasingly become of importance with the development of multimedia, and various types of display devices, such as an organic light-emitting diode (OLED) display device, a liquid crystal display (LCD) device, or the like, have been used.

A display device, which is a device for displaying an image, includes a display panel such as an OLED display panel or an LCD panel. The display panel may include light-emitting elements such as light-emitting diodes (LEDs), and the LEDs may be classified into OLEDs using an organic material as a fluorescent material, and inorganic LEDs (ILEDs) using an inorganic material as a fluorescent material.

SUMMARY

Embodiments of the present disclosure provide a display device including a new pad electrode structure.

Embodiments of the present disclosure also provide a display device including a new pad electrode structure that uses inorganic light-emitting diodes (ILEDs).

However, embodiments of the present disclosure are not restricted to those set forth herein. The above and other embodiments of the present disclosure will become more apparent to one of ordinary skill in the art to which the present disclosure pertains by referencing the detailed description of the present disclosure given below. According to the aforementioned and other embodiments of the present disclosure, some layers in a display area and a pad area can be merged and formed together by the same process. A display device having a new pad structure that includes pad electrodes that consist of layers located in the display area and can thus protect wire pads from subsequent processes can be provided.

In addition, the display device does not require a separate mask process for forming pad electrodes on wire pads. Thus, the number of mask processes that need to be performed in the pad area can be reduced, and as a result, the efficiency of the fabrication of the display device can be improved.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a display device includes a first substrate including a display area and a pad area, a wire pad on the first substrate in the pad area, first banks on the first substrate in the display area and spaced apart from each other, electrodes on the first banks and spaced apart from each other, a pad electrode base layer directly on the wire pad, having a greater width than the wire pad, and covering sides of the wire pad, a first insulating layer covering parts of the electrodes and part of the pad electrode base layer, light-emitting elements on the first insulating layer in the display area, respective ends of one of the light-emitting elements being on different ones of the electrodes, contact electrodes on the electrodes and contacting first ends of the light-emitting elements, and a pad electrode upper layer on the first insulating layer in the pad area and directly contacting the pad electrode base layer, wherein the pad electrode base layer includes the same material as the electrodes, and wherein the pad electrode upper layer includes the same material as the contact electrodes.

The first insulating layer may define a pad opening exposing part of a top surface of the pad electrode base layer, wherein the pad electrode upper layer contacts the exposed part of the top surface of the pad electrode base layer through the pad opening.

The pad electrode base layer may include an alloy of aluminum, wherein the pad electrode upper layer includes ITO, IZO, or ITZO.

The pad electrode base layer may be on the same layer as the wire pad.

The first insulating layer may have a greater width than the pad electrode base layer, and may be partially on the same layer as the pad electrode base layer and the wire pad, in the pad area.

The display device may further include a second insulating layer partially on the light-emitting elements, wherein the contact electrodes are on the second insulating layer and are spaced apart from each other.

The contact electrodes may directly contact different electrodes through openings that penetrate the first insulating layer to expose parts of top surfaces of the electrodes.

The second insulating layer might not be in the pad area.

The display device may further include a first interlayer insulating layer on the first substrate, a first data conductive layer on the first interlayer insulating layer, and including source and drain electrodes, a second interlayer insulating layer on the first data conductive layer, and a second data conductive layer on the first interlayer insulating layer and including voltage lines, wherein the wire pad is directly on the second interlayer insulating layer.

The display device may further include a third interlayer insulating layer on the second data conductive layer and excluded from the pad area, wherein the first banks are on the third interlayer insulating layer in the display area.

The first banks may be directly on the third interlayer insulating layer, wherein the third interlayer insulating layer is omitted from area where the first banks are spaced apart from each other to thereby expose the second interlayer insulating layer, and wherein sides of the third interlayer insulating layer are aligned with sides of the first banks.

At least part of the electrodes may be directly on the second interlayer insulating layer.

Opposing sides of the first banks may be inclined, wherein the light-emitting elements are between the first banks.

The display device may further include a second bank overlapping the first banks in a thickness direction, located over the first insulating layer, and surrounding an area in which the light-emitting elements are located.

The display area may include a cut area that is surrounded by the second bank, and in which the light-emitting elements are not located, wherein the electrodes and the first insulating layer are in the cut area, but are disconnected by a cut part, and wherein cut surfaces of the electrodes are aligned with cut surfaces of the first insulating layer.

According to some embodiments of the present disclosure, a display device includes a first substrate including a display area and a pad area, a data conductive layer on the first substrate and including power supply lines, which are in the display area, and a wire pad, which is in the pad area, first banks on the first substrate in the display area, and spaced apart from each other, first and second electrodes on the first banks in the display area, a pad electrode base layer in the pad area to cover the wire pad, a first insulating layer on the first electrode, the second electrode, and the pad electrode base layer and defining openings, light-emitting elements on the first insulating layer, between the first banks, and having respective ends on the first and second electrodes, first and second contact electrodes on the first and second electrodes in the display area, and contacting first ends of the light-emitting elements, and a pad electrode upper layer on the first insulating layer in the pad area, and directly contacting the pad electrode base layer.

The first electrode, the second electrode, and the pad electrode base layer may include the same material, wherein the first contact electrode, the second contact electrode, and the pad electrode upper layer include the same material.

The pad electrode base layer may have a greater width than the wire pad, wherein the first insulating layer and the pad electrode base layer are partially on the same layer as the wire pad in the pad area.

The display device may further include a first interlayer insulating layer on the first substrate and directly contacting the data conductive layer, and a second interlayer insulating layer on the data conductive layer, wherein the wire pad is directly on the second interlayer insulating layer.

The second interlayer insulating layer may expose part of the first interlayer insulating layer, wherein the first banks are directly on the second interlayer insulating layer so that the second interlayer insulating layer is aligned with inner sides of the first banks, and wherein parts of the first and second electrodes are directly on the first interlayer insulating layer.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
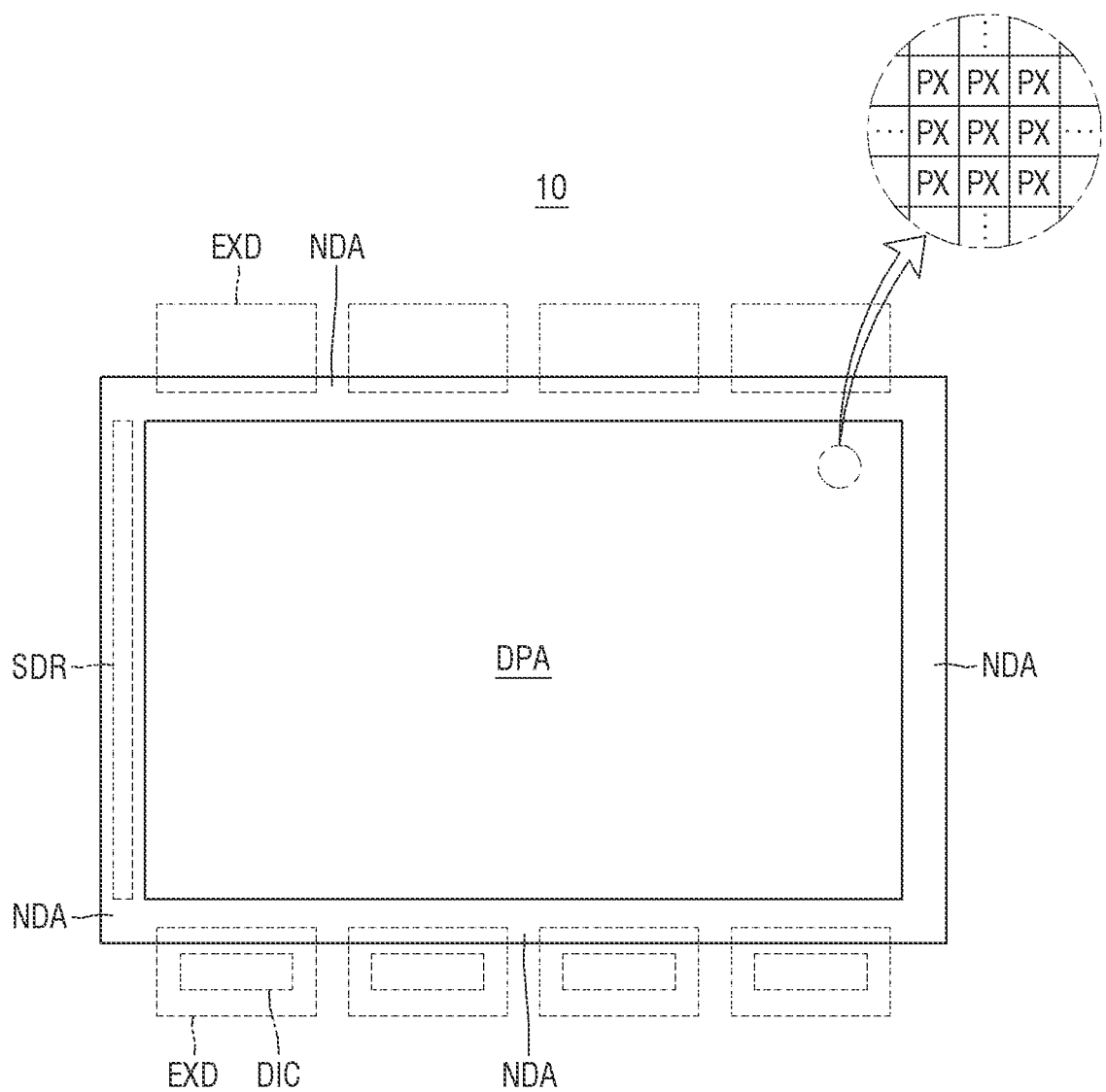
FIG. 1 is a plan view of a display device according to some embodiments of the present disclosure.

Embodiments of the present disclosure will now be described more fully hereinafter with reference to the accompanying drawings. The disclosed embodiments may, however, be embodied in different forms and should not be construed as limited to the embodiments set forth herein. Rather, these embodiments are provided so that this disclosure will be thorough and complete, and will filly convey the scope of the disclosure to those skilled in the art. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments of the present disclosure will hereinafter be described with reference to the accompanying drawings.

FIG. 1 is a plan view of a display device according to some embodiments of the present disclosure.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the present disclosure is not limited thereto.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a rectangular shape with rounded corners, another polygonal shape, or a circular shape. A display area DPA of the display device 10 may have a similar shape to the overall shape of the display device 10. FIG. 1 illustrates that the display device 10 and the display area DPA have a rectangular shape that extends longer in the horizontal direction than in the vertical direction.

The display device 10 may include the display area DPA and a non-display area NDA. The display area DPA is an area in which a screen is displayed, and the non-display area NDA is an area in which a screen is not displayed. The display area DPA may also be referred to as an active area, and the non-display area NDA may also be referred to as an inactive area. The display area DPA may generally account for a middle part of the display device 10.

The display area DPA may include a plurality of pixels PX. The pixels PX may be arranged in row and column directions. The pixels PX may have a rectangular or square shape in a plan view, but the present disclosure is not limited thereto. Alternatively, the pixels PX may have a rhombus shape that is inclined with respect to the first or second direction. The pixels PX may be alternately arranged in a stripe fashion or a PenTile fashion. Each of the pixels PX may include one or more light-emitting elements 30 that emit light (e.g., light of a predetermined or given wavelength range) to emit light of a color (e.g., a predetermined color).

The non-display area NDA may be located on the periphery of the display area DPA. The non-display area NDA may surround the entire display area DPA or part of the display area DPA. The display area DPA may have a rectangular shape, and the non-display area NDA may be located adjacent to four sides of the display area DPA. The non-display area NDA may form the bezel of the display device 10.

In the non-display area NDA, driving circuits or elements for driving the display area DPA may be located. In some embodiments, pad units may be provided on a display substrate of the display device 10 and in parts of the non-display area NDA adjacent to first and second long sides (e.g., the lower and upper sides) of the display device 10, and external devices EXD may be mounted on pad electrodes in the pad units. Examples of the external devices EXD may include connecting films, printed circuit boards, driving chips DIC, and wire connecting films. A scan driving unit SDR may be located in part of the non-display area NDA adjacent to a first short side (e.g., the left side) of the display device 10.

Figure 2:
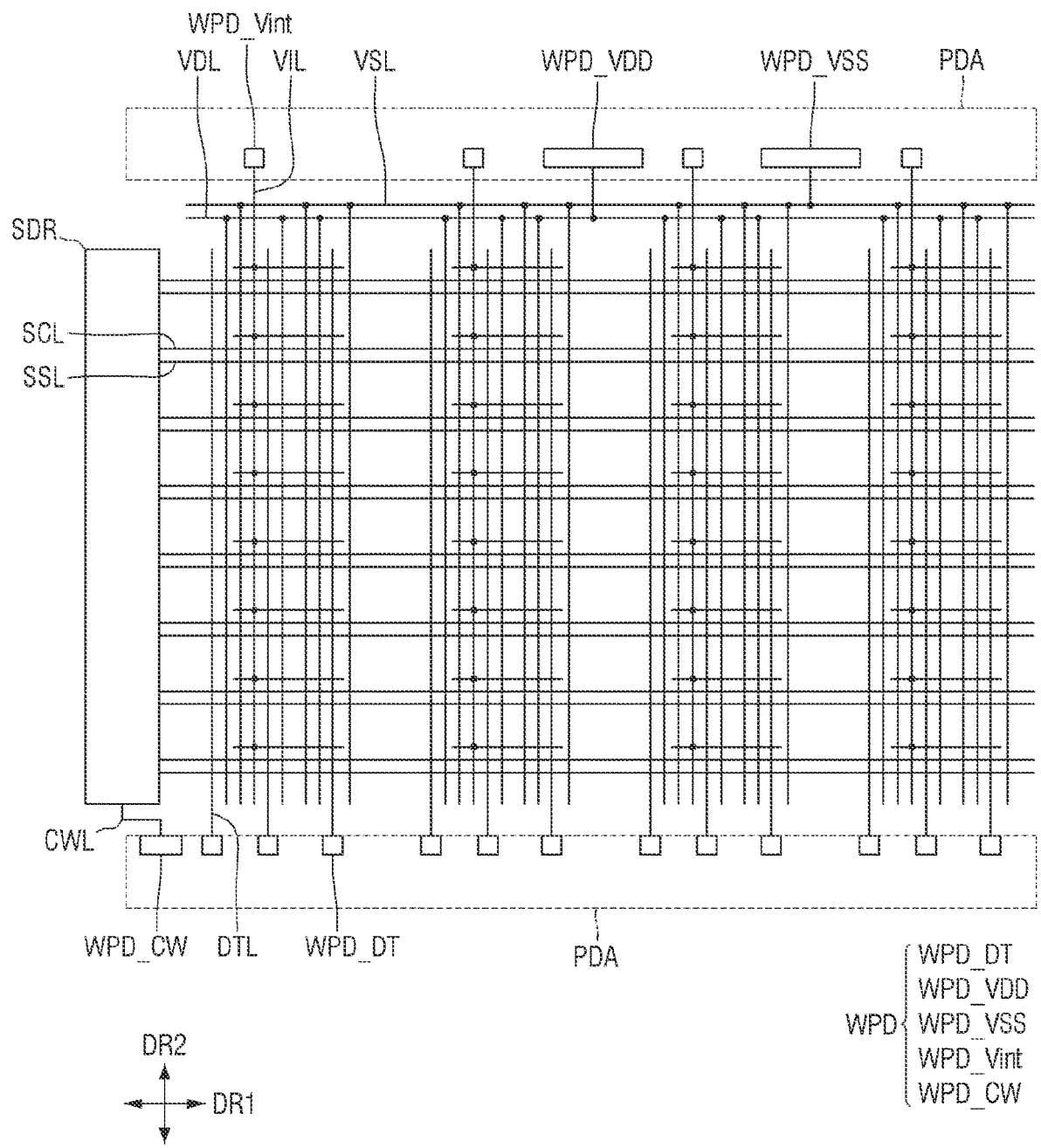
FIG. 2 is a layout view illustrating wires included in the display device of FIG.

FIG. 2 is a layout view illustrating wires included in the display device of FIG. 1.

Referring to FIG. 2, the display device 10 may include a plurality of wires. The plurality of wires may include scan lines SCL, sensing lines SSL, data lines DTL, initialization voltage lines VIL, first voltage lines VDL, and second voltage lines VSL. In some embodiments, the display device 10 may further include other wires.

The scan lines SCL and the sensing lines SSL may extend in a first direction DR1. The scan lines SCL and the sensing lines SSL may be connected to the scan driving unit SDR. The scan driving unit SDR may include a scan driving circuit and an emission signal control circuit. The scan driving unit SDR may be located on one side of the display area DPA (e.g., with respect the first direction DR1), but the present disclosure is not limited thereto. The scan driving unit SDR may be connected to a signal connecting line CWL, and at least one end of the signal connecting line CWL may form a pad WPD_CW in the non-display area NDA, and may thus be connected to the external devices EXD.

The term "connection", as used herein, may not only mean that two elements are physically in contact with, and connected to each other, but also mean that the two elements are connected via another element. One integral element may be understood as having parts thereof connected to one another. Also, the term "connection", as used herein, may encompass electrically connecting two elements with or without the mediation of another element.

The data lines DTL and the initialization voltage lines VIL may extend in a second direction DR2 that intersects the first direction DR1. The initialization voltage lines VIL may include parts that extend in the second direction DR2, and may include parts that branch off in the first direction DR1 from the parts that extend in the second direction DR2. The first voltage lines VDL and the second voltage lines VSL may include parts that extend in the second direction DR2, and may include parts that are connected to the parts that extend in the second direction DR2 to extend in the first direction DR1. The first voltage lines VDL and the second voltage lines VSL may have a mesh structure, but the present disclosure is not limited thereto. In some embodiments, each of the pixels PX of the display device 10 may be connected to at least one of the data lines DTL, one of the initialization voltage lines VIL, one of the first voltage lines VDL, and one of the second voltage lines VSL.

The data lines DTL, the initialization voltage wires VIL, the first voltage wires VDL, and the second voltage wires VSL may be electrically connected to one or more wire pads WPD. The wire pads WPD may be located in the non-display area NDA. In some embodiments, wire pads WPD_DT of the data lines DTL (hereinafter, data pads WPD_DT) may be located in a pad area PDA on one side of the display area DPA (e.g., with respect to the second direction DR2), and wire pads WPD_Vint of the initialization voltage wires VIL (hereinafter, initialization voltage pads WPD_Vint), wire pads WPD_VDD of the first voltage wires VDL (hereinafter, first power supply pads WPD_VDD), and wire pads WPD_VSS of the second voltage wires VSL (hereinafter, second power supply pads WPD_VSS) may be located in a pad area PDA on the other side of the display area DPA (e.g., with respect to the second direction DR2). In other embodiments, the data pads WPD_DT, the initialization voltage pads WPD_Vint, the first power supply pad WPD_VDD, and the second power supply pad WPD_VSS may all be located in the same area, for example, in part of the non-display area NDA on the upper side of the display area DPA. The external devices EXD may be mounted on the wire pads WPD. The external devices EXD may be mounted on the wire pads WPD via anisotropic conductive films or through ultrasonic bonding.

The pixels PX or subpixels PXn (where n is an integer of 1 to 3) of the display device 10 may include pixel driving circuits. The plurality of wires of the display device 10 may pass through, or pass by, the pixels PX to apply driving signals to the pixel driving circuits of the pixels PX. Each of the pixel driving circuits of the pixels PX may include transistors and capacitors. The numbers of transistors and capacitors in each of the pixel driving circuits of the pixels PX may vary. Each of the subpixels PXn of the display device 10 may have a "3T1C" structure in which three transistors and one capacitor are provided. The subpixels PXn will hereinafter be described as having the "3T1C" structure, but the present disclosure is not limited thereto. Various other pixel configurations such as "2T1C", "7T1C", and "6T1C" structures may also be applicable to the pixels PX.

Figure 3:
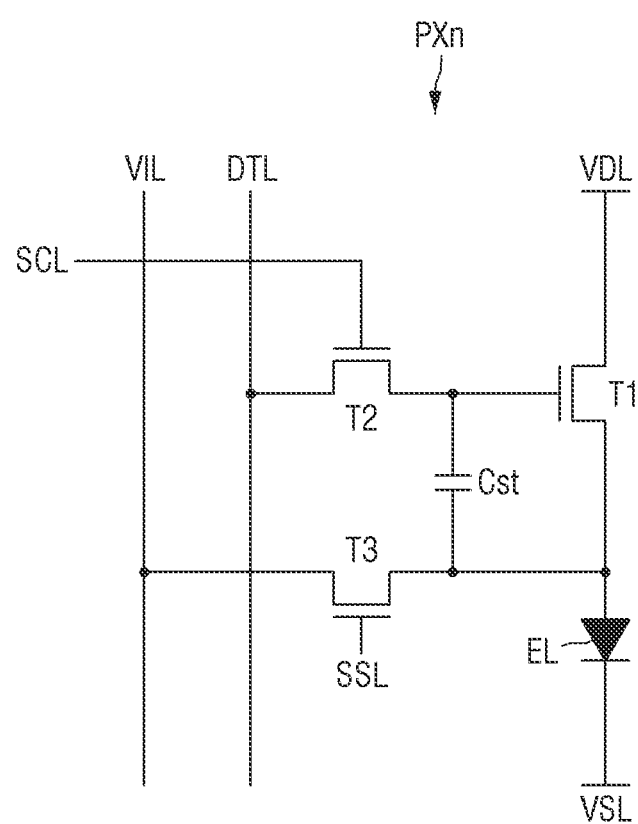
FIG. 3 is an equivalent circuit diagram of a subpixel according to some embodiments of the present disclosure.

FIG. 3 is an equivalent circuit diagram of a subpixel according to some embodiments of the present disclosure.

Referring to FIG. 3, a subpixel PXn of the display device 10 may include an LED "EL", three transistors (i.e., first, second, and third transistors T1, T2, and T3), and one storage capacitor Cst.

The LED "EL" emits light in accordance with a current supplied thereto via the first transistor T1. The LED "EL" includes a first electrode, a second electrode, and one or more light-emitting elements. The light-emitting elements may emit light of a given wavelength range in accordance with electrical signals transmitted thereto from the first and second electrodes.

A first end of the LED "EL" may be connected to the source electrode of the first transistor T1, and a second end of the LED "EL" may be connected to a second voltage line VSL to which a low-potential voltage (hereinafter, the second power supply voltage) is provided, the low-potential voltage being lower than a high-potential voltage (hereinafter, the first power supply voltage) provided to a first voltage line VDL.

The first transistor T1 adjusts a current that flows into the LED "EL" from the first voltage line VDL, to which the first power supply voltage is applied, in accordance with a difference in voltage between the gate electrode and the source electrode thereof. For example, the first transistor T1 may be a driving transistor for driving the LED "EL". The gate electrode of the first transistor T1 may be connected to the source electrode of the second transistor T2, the source electrode of the first transistor T1 may be connected to first electrode of the LED "EL", and the drain electrode of the first transistor T1 may be connected to the first voltage line VDL, to which the first power supply voltage is applied.

The second transistor T2 is turned on by a scan signal from a scan line SCL to connect a data line DTL to the gate electrode of the first transistor T1. The gate electrode of the second transistor T2 may be connected to the scan line SCL, the source electrode of the second transistor T2 may be connected to the gate electrode of the first transistor T1, and the drain electrode of the second transistor T2 may be connected to the data line DTL.

The third transistor T3 is turned on by a sensing signal from a sensing line SSL to connect an initialization voltage line VIL to the first end of the LED "EL". The gate electrode of the third transistor T3 may be connected to the sensing line SSL, the drain electrode of the third transistor T3 may be connected to the initialization voltage line VIL, and the source electrode of the third transistor T3 may be connected to the first end of the LED "EL" or the source electrode of the first transistor T1.

The source electrodes and the drain electrodes of the first, second, and third transistors T1, T2, and T3 are not limited to the above description, but may be switched in other embodiments.

The storage capacitor Cst may be formed between the gate electrode and the source electrode of the first transistor T1. The storage capacitor Cst stores a differential voltage corresponding to the difference between the gate voltage and the source voltage of the first transistor T1.

The first, second, and third transistors T1, T2, and T3 may be formed as thin-film transistors (TFTs). FIG. 3 illustrates that the first, second, and third transistors T1, T2, and T3 are formed as N-type metal-oxide semiconductor field-effect transistors (MOSFETs), but the present disclosure is not limited thereto. Alternatively, the first, second, and third transistors T1, T2, and T3 may be formed as P-type MOSFETs. Yet alternatively, some of the first, second, and third transistors T1, T2, and T3 may be formed as N-type MOSFETs, and the other transistors may be formed as P-type MOSFETs.

Figure 4:
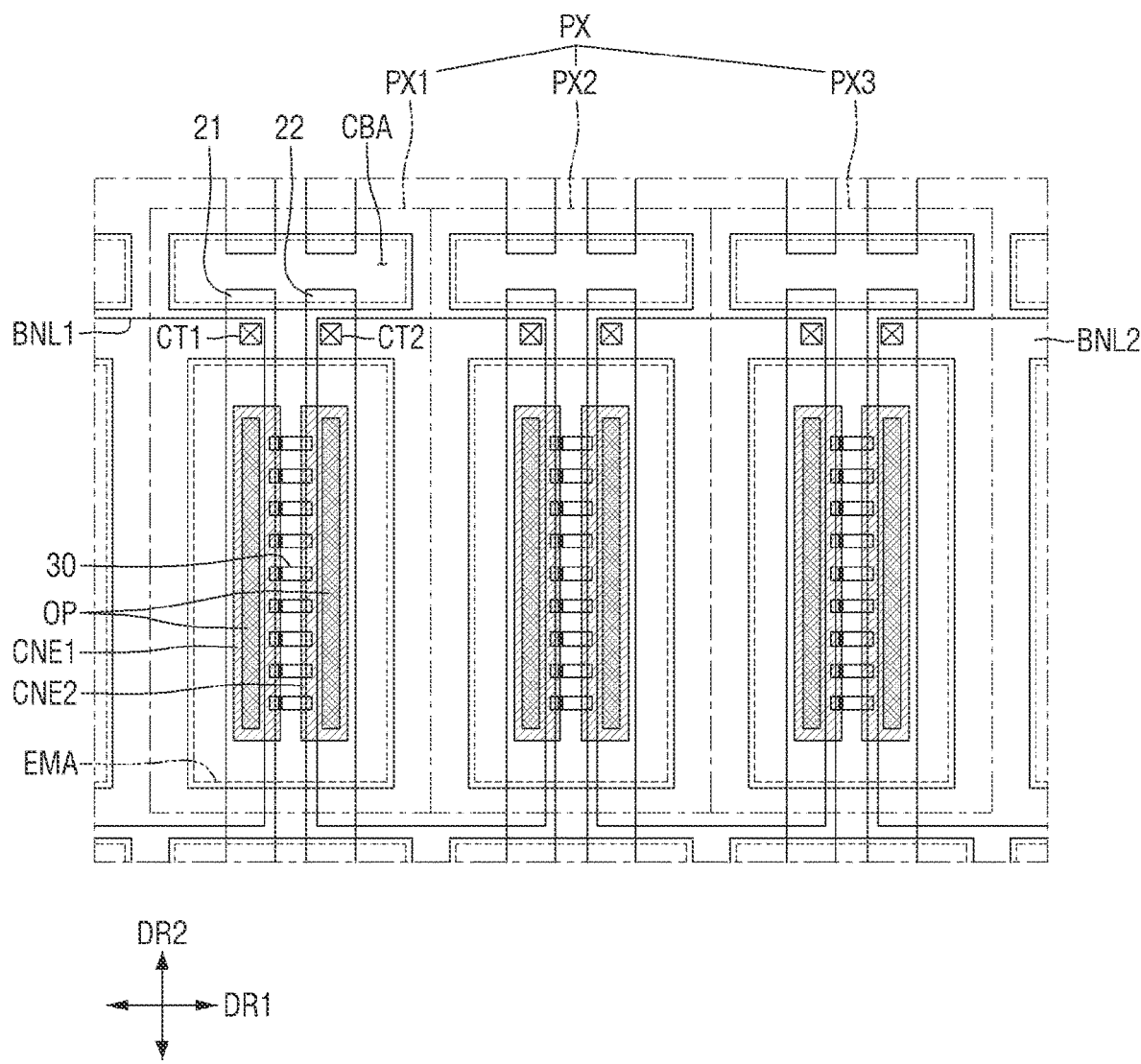
FIG. 4 is a plan view illustrating a pixel of the display device of FIG. 1.

FIG. 4 is a plan view illustrating a pixel of the display device of FIG. 1.

Referring to FIG. 4, a pixel PX may include a plurality of subpixels PXn (where n is an integer of 1 through 3). For example, the pixel PX may include first, second, and third subpixels PX1, PX2, and PX3. The first subpixel PX1 may emit light of a first color, the second subpixel PX2 may emit light of a second color, and the third subpixel PX3 may emit light of a third color. However, the present disclosure is not limited to this. Alternatively, the plurality of subpixels PXn may emit light of the same color. FIG. 2 illustrates that the pixel PX includes three subpixels PXn, but the present disclosure is not limited thereto. Alternatively, the pixel PX may include more than three subpixels PXn.

Each of the plurality of subpixels PXn may include an emission area EMA and a non-emission area. The emission area EMA may be an area in which one or more light-emitting elements 30 are located to emit light of a given wavelength range, and the non-emission area may be an area at which light emitted from the light-emitting elements 30 does not arrive, and thus no light is emitted therefrom. The emission area EMA may include an area in which the light-emitting elements 30 are located, and an area that outputs light emitted from the light-emitting elements 30.

However, the present disclosure is not limited to this. The emission area EMA may further include an area in which light emitted from the light-emitting elements 30 is reflected or refracted by another element. A plurality of light-emitting elements 30 may be located in the plurality of subpixels PXn, and a plurality of emission areas EMA, including both areas where the plurality of light-emitting elements 30 are located and areas adjacent to the areas where the plurality of light-emitting elements 30 are located, may be formed.

Each of the plurality of subpixels PXn may include a cut area CBA, which is located in the non-emission area. The cut area CBA may be located on one side of the emission area EMA with respect to the second direction DR2. The cut area CBA may be located between emission areas EMA of a pair of adjacent subpixels PXn in the second direction DR2. In the display area DPA of the display device 10, a plurality of emission areas EMA and a plurality of cut areas CBA may be arranged. For example, the plurality of emission areas EMA may be arranged one after another in the first direction DR1 and/or the plurality of cut areas CBA may be arranged one after another in the first direction DR1, and the plurality of emission areas EMA and the plurality of cut areas CBA may be alternately arranged in the second direction DR2. The distance between the cut areas CBA in the first direction DR1 may be smaller than the distance between the plurality of emission areas EMA in the first direction DR1.

A second bank BNL2 may be located between the plurality of cut areas CBA and the plurality of emission areas EMA, and the distance between the plurality of cut areas CBA and the plurality of emission areas EMA may be determined by the width of the second bank BNL2. No light-emitting elements 30 are located in the plurality of cut areas CBA so that no light is emitted from the plurality of cut areas CBA, but parts of electrodes 21 and 22, which are located in each of the plurality of subpixels PXn, may be located in the corresponding cut area CBA to be isolated from each other.

Figure 5:
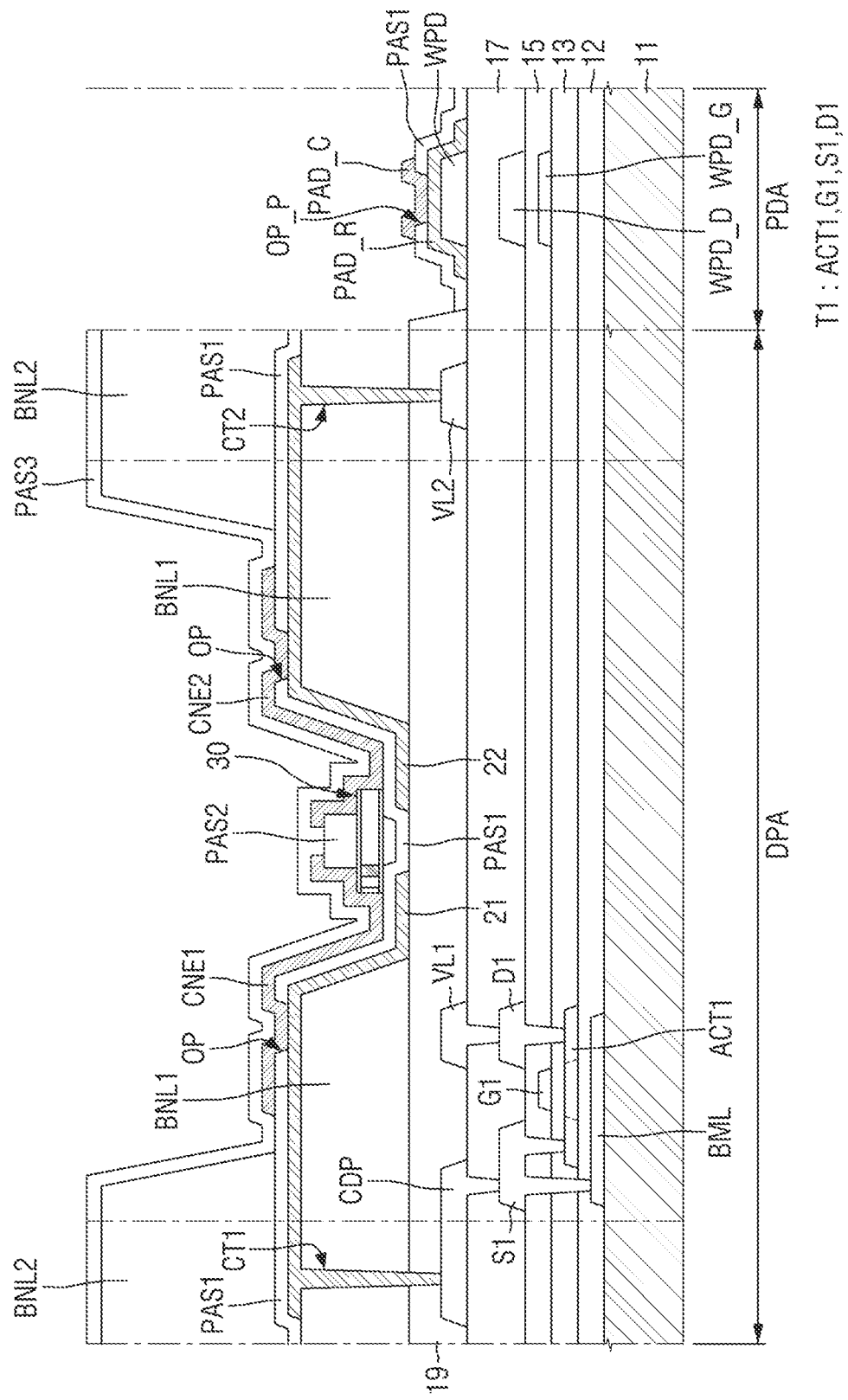
FIG. 5 is a cross-sectional view illustrating a display area and a pad area of the display device of FIG. 1.
Figure 6:
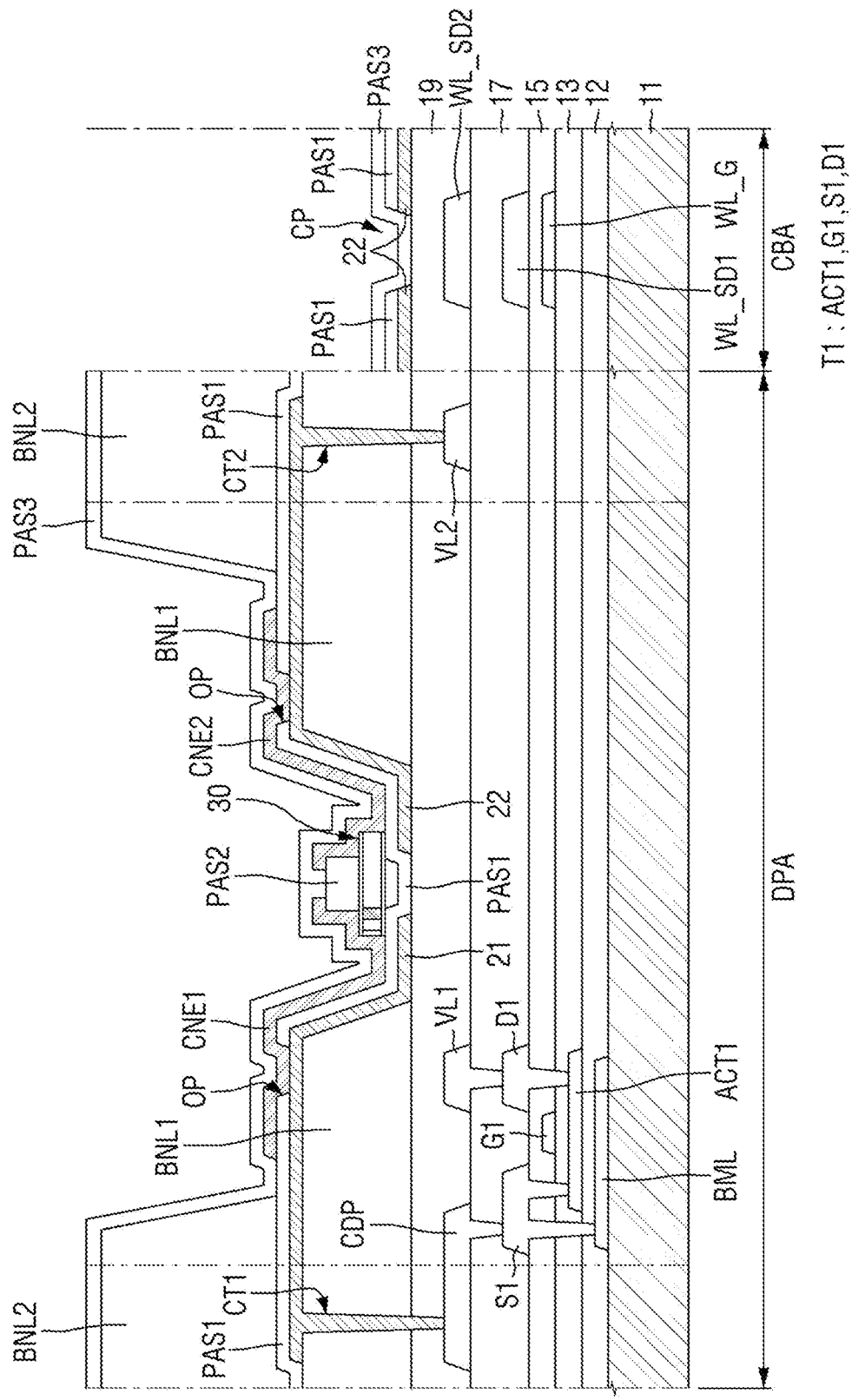
FIG. 6 is a partial cross-sectional view of a subpixel of the display device of FIG. 1.

FIG. 5 is a cross-sectional view illustrating the display area and the pad area of the display device of FIG. 1, and FIG. 6 is a partial cross-sectional view of a subpixel of the display device of FIG. 1.

For example, FIG. 5 is a cross-sectional view illustrating the arrangement of electrodes 21, 22, at least one light-emitting element 30, and contact electrodes CNE1, CNE2 in an emission area EMA of a subpixel PXn and the arrangement of a pad electrode PAD_R, PAD_C in the pad area PDA, and FIG. 6 is a cross-sectional view illustrating the emission area EMA and a cut area CBA of the display area DPA. FIG. 5 illustrates that there exists only one transistor (e.g., a first transistor T1) in each subpixel PXn, although, as already mentioned above, three transistors (e.g., the first transistor T1 and second and third transistors T2 and T3) and one storage capacitor Cst may be located in each subpixel PXn. FIGS. 5 and 6 are simply for illustrating the relative arrangement of elements located in each of the display area DPA and the pad area PDA, and the structure of the display device 10 is not limited to that illustrated in FIG. 5 or 6.

Referring to FIGS. 5 and 6, the display device 10 may include a first substrate 11 and a semiconductor layer, a plurality of conductive layers, and a plurality of insulating layers, which are located on the first substrate 11. The semiconductor layer, the conductive layers, and the insulating layers may form a circuit layer and a light-emitting element layer of the display device 10.

For example, the first substrate 11 may be an insulating substrate. The first substrate 11 may be formed of an insulating material such as glass, quartz, or a polymer resin. Also, the first substrate 11 may be a rigid substrate, but may be a flexible substrate that is bendable, foldable, or rollable. The first substrate 11 may include a display area DPA, a non-display area NDA, and a pad area PDA.

A light-blocking layer BML may be located on the first substrate 11. The light-blocking layer BML is located in the display area DPA to overlap with an active layer ACT1 of the first transistor T1. The light-blocking layer BML may include a material capable of blocking light and may thus reduce or prevent light incident upon the active layer ACT1 of the first transistor T1. Also, the light-blocking layer BML may be electrically connected to a source electrode S1 of the first transistor T1 via a contact hole to reduce or prevent a change in the voltage of the first transistor T1. For example, the light-blocking layer BML may be formed as a double-layer film of Ti and Cu, which are opaque metals capable of blocking the transmission of light, but the present disclosure is not limited thereto. The light-blocking layer BML may be omitted in other embodiments.

A buffer layer 12 may be located on the entire surface of the first substrate 11 including the light-blocking layer BML. That is, the buffer layer 12 may be located in and across the display area DPA and the pad area PDA of the first substrate 11. The buffer layer 12 may be formed on the first substrate 11 to protect the first transistor T1 from moisture that may otherwise penetrate the first substrate 11, which is susceptible to moisture, and may perform a surface planarization function. The buffer layer 12 may include a plurality of inorganic layers that are alternately stacked. For example, the buffer layer 12 may be formed as a multilayer film in which inorganic layers including at least one of silicon oxide (SiOx), silicon nitride (SiNx), and silicon oxynitride (SiON) are alternately stacked.

The semiconductor layer is located on the buffer layer 12. The semiconductor layer may include the active layer ACT1 of the first transistor T1, which is located in the display area DPA. The semiconductor layer may be located to partially overlap with a gate electrode G1 in a first gate conductive layer.

The semiconductor layer may include polycrystalline silicon, monocrystalline silicon, or an oxide semiconductor. In a case where the semiconductor layer includes an oxide semiconductor, the active layer ACT1 may include a plurality of conductor regions and channel regions between the conductor regions. The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO), but the present disclosure is not limited thereto.

Alternatively, the semiconductor layer may include polycrystalline, which is formed by crystallizing amorphous silicon. In this case, the conductor regions of the active layer ACT1 may be regions doped with impurities.

A first gate insulating layer 13 is located on the semiconductor layer and the buffer layer 12, and in and across the display area DPA and the pad area PDA. The first gate insulating layer 13 may function as the gate insulating film of each of the first through third transistors T1 through T3. The first gate insulating layer 13 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON).

The first gate conductive layer is located on the first gate insulating layer 13. The first gate conductive layer may include the gate electrode G1 of the first transistor T1, which is located in the display area DPA, and a gate pad WPD_G, which is located in the pad area PDA. The gate electrode G1 may be located to overlap with the channel region of the active layer ACT1 in a thickness direction (e.g., the thickness direction corresponding to a thickness of the display panel).

In some embodiments, the first gate conductive layer may further include a first capacitance electrode of the storage capacitor Cst, a scan line SCL, and a sensing line SSL, which are located in the display area DPA.

In some embodiments, the first gate conductive layer may include the gate pad WPD_G, which is located in the pad area PDA. A wire pad WPD may be located in the pad area PDA, which is on one side of the non-display area NDA of the display device 10. The wire pad WPD may be connected to an external device EXD, which is mounted on the wire pad WPD via the pad electrode PAD_R, PAD_C. The gate pad WPD_G may be electrically connected to the wire pad WPD. For example, in some embodiments, the wire pad WPD may be connected to the gate pad WPD_G via a contact hole. An electrical signal applied from the external device EXD to the wire pad WPD may be transmitted to the first gate conductive layer via the gate pad WPD_G. Electrical signals applied to the display area DPA via the wire pad WPD may be transmitted via a different conductive layer from the wire pad WPD, and thus, the display area DPA may be completely sealed from the outside. However, the present disclosure is not limited thereto. The gate pad WPD_G of the first gate conductive layer may be omitted in other embodiments.

The first gate conductive layer may be formed as a single- or multilayer-film including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

An interlayer insulating layer (e.g., a first interlayer insulating layer) 15 is located on the first gate conductive layer. The first interlayer insulating layer 15 may function as an insulating film between the first gate conductive layer and layers located on the first gate conductive layer. Also, the first interlayer insulating layer 15 may cover the first gate conductive layer to protect the first gate conductive layer. The first interlayer insulating layer 15 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON).

A first data conductive layer is located on the first interlayer insulating layer 15. The first data conductive layer may include the source electrode S1 and a drain electrode D1 of the first transistor T1, which are located in the display area DPA, and a data pad WPD_D, which is located in the pad area PDA.

The source and drain electrodes S1 and D1 of the first transistor T1 may be in contact with doping regions of the active layer ACT1 via contact holes that penetrate the first interlayer insulating layer 15 and the first gate insulating layer 13. Also, the source electrode S1 of the first transistor T1 may be electrically connected to the light-blocking layer BML via another contact hole.

In some embodiments, the first data conductive layer may further include a second capacitance electrode of the storage capacitor Cst, which is located in the display area DPA, and a data line DTL.

In some embodiments, the first data conductive layer may include the data pad WPD_D, which is located in the pad area PDA. The data pad WPD_D, like the gate pad WPD_G, may be electrically connected to the wire pad WPD. For example, in some embodiments, the wire pad WPD may be connected to the data pad WPD_D via a contact hole, and an electrical signal applied from the external device EXD to the wire pad WPD may be transmitted to the first data conductive layer via the data pad WPD_D. However, the present disclosure is not limited thereto. The data pad WPD_D of the first data conductive layer may not be provided.

The first data conductive layer may be formed as a single-layer or multilayer film including Mo, Al, Cr, Au, Ti, Ni, Nd, Cu, or an alloy thereof, but the present disclosure is not limited thereto.

A second interlayer insulating layer 17 is located on the first data conductive layer. The second interlayer insulating layer 17 may function as an insulating film between the first data conductive layer and layers located on the first data conductive layer. Also, the second interlayer insulating layer 17 may cover the first data conductive layer to protect the first data conductive layer. The second interlayer insulating layer 17 may be formed as an inorganic layer including an inorganic material such as, for example, silicon oxide (SiOx), silicon nitride (SiNx), or silicon oxynitride (SiON) or as a stack of silicon oxide (SiOx), silicon nitride (SiNx), and/or silicon oxynitride (SiON).

A second data conductive layer is located on the second interlayer insulating layer 17. The second data conductive layer may include a first voltage line VL1, a second voltage line VL2, and a first conductive pattern CDP, which are located in the display area DPA, and the wire pad WPD, which is located in the pad area PDA. A high-potential voltage (or the first power supply voltage) provided to the first transistor T1 may be applied to the first voltage line VL1, and a low-potential voltage (or the second power supply voltage) provided to a second electrode 22 may be applied to the second voltage line VL2. A light-emitting element alignment signal for aligning the light-emitting element 30 may also be applied to the second voltage line VL2 during the fabrication of the display device 10.

The first conductive pattern CDP may be connected to the source electrode S1 of the first transistor T1 via a contact hole formed in the second interlayer insulating layer 17. The first conductive pattern CDP may be electrically connected to the drain electrode D1 and to a first electrode 21. For example, the first transistor T1 may transmit the first power supply voltage, applied from the first voltage line VL1, to the first electrode 21 via the first conductive pattern CDP. The second data conductive layer is illustrated as including one first voltage line VL1 and one second voltage line VL2, but the present disclosure is not limited thereto. Alternatively, the second data conductive layer may include more than one first voltage line VL1 and more than one second voltage line VL2.

The wire pad WPD may be located in the pad area PDA and may be connected to the external device EXD mounted thereon. In some embodiments, the wire pad WPD may be connected to the external device EXD via the pad electrode PAD_R, PAD_C, which is located above the wire pad WPD. A first planarization layer 19 may be further located on the second data conductive layer, while not being on the wire pad WPD, so that the wire pad WPD may be exposed. In the display device 10, the pad electrode PAD_R, PAD_C, which caps the wire pad WPD from above and connects the wire pad WPD to the external device EXD, and an insulating layer (e.g., a first insulating layer PAS1), may be formed of the same layer(s) as layers located in the display area DPA. In the display device 10, a plurality of layers including the circuit layer, which is formed by a plurality of conductive layers, and a display element layer, which is located on the circuit layer, may be stacked. The pad electrode PAD_R, PAD_C, which is located in the pad area PDA, may be formed by the same process as layers located in the display area DPA, and some processes of the fabrication of the display device 10 may be performed together later with other processes of the fabrication of the display device 10. Accordingly, the number of unnecessary processes can be reduced, as will be described later in detail.

The second data conductive layer may be formed as a single-layer or multilayer film including Mo, Al, Cr, Au, Ti, Ni, Nd, Cu, or an alloy thereof, but the present disclosure is not limited thereto.

The first planarization layer 19 is located on the second data conductive layer. The first planarization layer 19 may be located on the entire surface of the display area DPA and may perform a surface planarization function. The first planarization layer 19 may include an organic insulating material such as, for example, polyimide (PI). The first planarization layer 19 may be omitted from the pad area PDA, or may be located only in part of the pad area PDA, to enable exposure of the wire pad WPD. The first planarization layer 19 may not be provided.

A plurality of first banks BNL1, a plurality of electrodes 21, 22, the light-emitting element 30, a plurality of contact electrodes CNE1, CNE2, and a second bank BNL2 may be located on the first planarization layer 19 in the display area DPA. Also, a plurality of insulating layers PAS1, PAS2, and PAS3 may be located on the first planarization layer 19. The pad electrode PAD_R, PAD_C and the first insulating layer PAS1 may be located in the pad area PDA. The display element layer, which is located in the display area DPA, will hereinafter be described first, and then the wire pad WPD and the pad electrode PAD_R, PAD_C, which are located in the pad area PDA, will be described.

The first banks BNL1 are located in the display area DPA of the first substrate 11. For example, the first banks BNL1 may be located on the first planarization layer 19. The first banks BNL1 may extend in the second direction DR2 only within each subpixel PXn, while not extending into other neighboring subpixels PXn in the second direction DR2. For example, the first banks BNL1 may be formed to extend longer in the second direction DR2 than the emission area EMA of each subpixel PXn, while not extending into the cut area CBA of the corresponding subpixel PXn and other neighboring subpixels PXn in the second direction DR2. Accordingly, part of the second bank BNL2 that is located between the emission area EMA and the cut area CBA of each subpixel PXn, and part of the second bank BNL2 that divides each pair of adjacent subpixels PXn in the second direction DR2, may be located on the first banks BNL1.

The first banks BNL1 may be located to be spaced apart from each other in the first direction DR1. The first banks BNL1 may have a width (e.g., a predetermined width, or a given width) in the first direction DR1, and may be located across the boundary between each pair of adjacent subpixels PXn in the first direction DR1. The first banks BNL1 may include the emission areas EMA of each pair of adjacent subpixels PXn in the first direction DR1, and may be located across the boundary between each pair of adjacent subpixels PXn in the first direction DR1. Accordingly, part of the second banks BNL2 that extends in the second direction DR2 may be located on the first banks BNL1. Two first banks BNL1 may be partially located in each subpixel PXn to be spaced apart from each other with light-emitting elements 30, or portions thereof, located therebetween.

Two first banks BNL1 are illustrated as being located in each subpixel PXn, but the present disclosure is not limited thereto. More than two first banks BNL1 may be located in each subpixel PXn, depending on the number of electrodes 21, 22 provided in each subpixel PXn. Also, the shape of the first banks BNL1 is not particularly limited, and the first banks BNL1 may occupy a smaller area in each subpixel PXn.

The first banks BNL1 may protrude, at least in part, from the top surface of the first planarization layer 19. Parts of the first banks BNL1 that protrude may have inclined side surfaces, and light emitted from the light-emitting element 30 may be reflected from the electrodes 21, 22, which are located on the first banks BNL1, to be emitted in an upward direction from the first planarization layer 19. The first banks BNL1 may not only provide an area in which to arrange the light-emitting element 30, but also may function as a reflecting barrier capable of reflecting light emitted from the light-emitting element 30 in the upward direction from the first planarization layer 19. The sides of the first banks BNL1 may be linearly inclined, but the present disclosure is not limited thereto. Alternatively, the first banks BNL1 may have a semi-circular or elliptical shape with a curved outer surface. The first banks BNL1 may include an organic insulating material such as polyimide (PI), but the present disclosure is not limited thereto.

A plurality of electrodes 21, 22 may be located on the first banks BNL1 and the first planarization layer 19. The electrodes may be referred to as the first and second electrodes 21 and 22. The first and second electrodes 21 and 22 may extend in the second direction DR2 and may be spaced apart from each other in the first direction DR1.

The first and second electrodes 21 and 22 may extend in the second direction DR2 in each subpixel PXn, and may be separated from other electrodes 21, 22 by the cut area CBA of the corresponding subpixel PXn. For example, referring to FIG. 4, a cut area CBA may be located between the emission areas EMA of two adjacent subpixels PXn that are adjacent in the second direction DR2, and first and second electrodes 21 and 22 of one of the two adjacent subpixels PXn may be separated from first and second electrodes 21 and 22 of the other subpixel PXn (e.g., by a cut part CP as shown in FIG. 6), but the present disclosure is not limited thereto. Alternatively, some electrodes 21, 22 may not be segmented between subpixels PXn, but may be located to extend across the boundary between each pair of adjacent subpixels PXn in the second direction DR2, or it may be that only one of the first and second electrodes 21 and 22 is segmented between the subpixels PXn.

The first electrode 21 may be electrically connected to the first transistor T1 via a first contact hole CT1, and the second electrode 22 may be electrically connected to the second voltage line VL2 via a second contact hole CT2. For example, the first electrode 21 may be in contact with the first conductive pattern CDP via the first contact hole CT1, which penetrates one of the first banks BNL1 and the first planarization layer 19 in an area where the second bank BNL2 extends in the first direction DR1, and the second electrode 22 may be in contact with the second voltage line VL2 via a second contact hole CT2, which penetrates the other first bank BNL1 and the first planarization layer 19 in the area where the second bank BNL2 extends in the first direction DR1. However, the present disclosure is not limited to this example. In another example, the first and second contact holes CT1 and CT2 may be located in the emission area EMA of each subpixel PXn, surrounded by the second bank BNL2.

One first electrode 21 and one second electrode 22 are illustrated as being provided in each subpixel PXn, but the present disclosure is not limited thereto. More than one first electrode 21 and more than one second electrode 22 may be provided in each subpixel PXn. Also, in each subpixel PXn, the first and second electrodes 21 and 22 may not necessarily extend in one direction but may be arranged in various other fashions. For example, the first and second electrodes 21 and 22 may be partially curved or bent, or one of the first and second electrodes 21 and 22 may be located to surround the other electrode.

The first and second electrodes 21 and 22 may be located on their respective first banks BNL1. The first and second electrodes 21 and 22 may be formed to have a smaller width than the first banks BNL1. For example, the first and second electrodes 21 and 22 may be formed to cover only first sides of their respective first banks BNL1. The first and second electrodes 21 and 22 may be located on the sides of their respective first banks BNL1, and the distance between the first and second electrodes 21 and 22 may be smaller than the distance between the first banks BNL1. The first and second electrodes 21 and 22 may be located, at least in part, directly on the first planarization layer 19 and may thus fall on the same plane, but the present disclosure is not limited thereto. Alternatively, the first and second electrodes 21 and 22 may have a greater width than the first banks BNL1.

The electrodes 21, 22 may include a conductive material with high reflectance. For example, the electrodes 21, 22 may include a metal with high reflectance such as silver (Ag), Cu, or Al or may include an alloy of Al, Ni, or lanthanum (La). The electrodes 21, 22 may reflect light that is emitted from the light-emitting element 30 to travel toward the sides of the first banks BNL1, and in an upward direction from each subpixel PXn.

However, the present disclosure is not limited to this, and the electrodes 21, 22 may further include a transparent conductive material. For example, each of the electrodes 21, 22 may form a structure in which a transparent conductive material and a metal with high reflectance are stacked into more than one layer, or may be formed as a single layer including a transparent conductive material and a metal with high reflectance. For example, each of the electrodes 21, 22 may have a stack of ITO/Ag/ITO, ITO, ITO/Ag/IZO, or ITO/Ag/ITZO/IZO.

The electrodes 21, 22 may be electrically connected to the light-emitting element 30, and a voltage (e.g., a predetermined voltage) may be applied to each of the electrodes 21, 22 so that the light-emitting element 30 can emit light. The electrodes 21, 22 may be electrically connected to the light-emitting element 30 via the contact electrodes CNE1, CNE2, and electrical signals applied to the electrodes 21, 22 may be transmitted to the light-emitting element 30 via the contact electrodes CNE1, CNE2.

One of the first and second electrodes 21 and 22 may be electrically connected to an anode electrode of the light-emitting element 30, and the other electrode may be connected to a cathode electrode of the light-emitting element 30. However, the present disclosure is not limited to this. Alternatively, one of the first and second electrodes 21 and 22 may be electrically connected to the cathode electrode of the light-emitting element 30, and the other electrode may be connected to the anode electrode of the light-emitting element 30.

The electrodes 21, 22 may be used to generate an electric field in each subpixel PXn to align the light-emitting element 30. The light-emitting element 30 may be located between the first and second electrodes 21 and 22 by the electric field formed on/by the first and second electrodes 21 and 22. The light-emitting element 30 may be sprayed on the electrodes 21, 22 via inkjet printing. If ink including the light-emitting element 30 is sprayed on the electrodes 21, 22, an alignment signal may be applied to the electrodes 21, 22 to generate an electric field. The light-emitting element 30 scattered in the ink may be properly aligned on the electrodes 21, 22 by an electrophoretic force from the electric field generated on the electrodes 21, 22.

The first insulating layer PAS1 is located on the first planarization layer 19. The first insulating layer PAS1 may be located to cover the first banks BNL1, the first electrode 21, and the second electrode 22. Also, the first insulating layer PAS1 may be located to cover part of the wire pad WPD in the pad area PDA. The first insulating layer PAS1 may protect the first and second electrodes 21 and 22, and may insulate the first and second electrodes 21 and 22 from each other. Also, the first insulating layer PAS1 may reduce or prevent direct contact of the light-emitting element 30, which is located on the first insulating layer PAS1, with other elements, thereby reducing or preventing damage thereto.

The first insulating layer PAS1 may include openings OP, which partially expose the first and second electrodes 21 and 22. The openings OP may partially expose parts of the first and second electrodes 21 and 22 that are located on the top surfaces of the first banks BNL1. Parts of the contact electrodes CNE1, CNE2 may be in contact with the parts of the electrodes 21, 22, exposed through the openings OP.

The first insulating layer PAS1 may be formed to have a height difference, and as a result, part of the top surface of the first insulating layer PAS1 may be recessed between the first and second electrodes 21 and 22. For example, the first insulating layer PAS1 may be located to cover the first and second electrodes 21 and 22, and may thus have a stepped top surface in accordance with the shapes of the electrodes 21, 22 located therebelow, but the present disclosure is not limited thereto.

The second bank BNL2 may be located on the first insulating layer PAS1.

The second bank BNL2 may include parts that extend in the first direction DR1 and parts that extend in the second direction DR2, and may thus be located in a lattice pattern on the entire surface of the display area DPA in a plan view. The second bank BNL2 may be located along the boundaries between subpixels PXn to define the subpixels PXn. Also, the second bank BNL2 may be located to surround the outer edges of the display area DPA, while being omitted from the pad area PDA so that the wire pad WPD may be exposed.

The second bank BNL2 may be located to surround the emission area EMA and the cut area CBA located in each subpixel PXn to define each subpixel PXn. The first and second electrodes 21 and 22 may extend in the second direction DR2 to extend across part of the second bank BNL2 that extends in the first direction DR1. Part of the second bank BNL2 that extends in the second direction DR2 may have a greater width between emission areas EMA than between cut areas CBA.

Accordingly, the distance between the cut areas CBA may be smaller than the distance between the emission areas EMA.

In some embodiments, parts of the second bank BNL2 may be located on the first banks BNL1 and may be formed to have a greater height than the first banks BNL1. The second bank BNL2 may reduce or prevent ink sprayed into each subpixel PXn that may otherwise spill over to other neighboring subpixels PXn during inkjet printing, as performed in the fabrication of the display device 10, and may thus separate ink having different light-emitting elements 30 scattered therein for different subpixels PXn. The second bank BNL2, like the first banks BNL1, may include polyimide (PI), but the present disclosure is not limited thereto.

The light-emitting element 30 may be located on the first insulating layer PAS1. For example, a plurality of light-emitting elements 30 may be located in a plurality of subpixels PXn to be spaced apart from one another in the direction in which the electrodes 21, 22 extend (e.g., in the second direction DR2), and may be aligned substantially in parallel to one another. The light-emitting element 30 may extend in one direction, and the direction in which the light-emitting element 30 extends may form a substantially right angle with the direction in which the electrodes 21, 22 extend. However, the present disclosure is not limited to this. Alternatively, the light-emitting element 30 may be located at an inclination with respect to the direction in which the electrodes 21, 22 extend.

A plurality of light-emitting elements 30 located in a plurality of subpixels PXn may include light-emitting layers (e.g., a light-emitting layer 36 shown in FIG. 7) having different materials, and may thus emit light of different wavelength ranges to the outside of the display panel. Accordingly, the first, second, and third subpixels PX1, PX2, and PX3 can emit light of the first, second, and third colors, respectively, but the present disclosure is not limited thereto. Alternatively, the plurality of subpixels PXn may include light-emitting elements 30 of the same type, and may thus emit light of substantially the same color.

The light-emitting element 30 may be located between the first banks BNL1 so that respective ends of the light-emitting elements 30 may be placed on the electrodes 21, 22. The length of the light-emitting element 30 may be greater than the distance between the first and second electrodes 21 and 22, and both ends of the light-emitting element 30 may be located on the first and second electrodes 21, 22, respectively. For example, a first end of the light-emitting element 30 may be located on the first electrode 21, and a second end of the light-emitting element 30 may be located on the second electrode 22.

In the light-emitting element 30, a plurality of layers may be located in a direction perpendicular to the top surface of the first substrate 11 or the first planarization layer 19. The light-emitting element 30 may be located so that the direction in which the light-emitting element 30 extends may be parallel to the top surface of the first planarization layer 19, and the semiconductor layers included in the light-emitting element 30 may be sequentially located along a direction that is parallel to the top surface of the first planarization layer 19. However, the present disclosure is not limited to this. Alternatively, the semiconductor layers included in the light-emitting element may be located in a direction that is perpendicular to the top surface of the first planarization layer 19.

Both ends of the light-emitting element 30 may be in contact with the contact electrodes CNE1, CNE2. For example, an insulating film (e.g., an insulating film 38 shown in FIG. 7) might not be formed on ends of the light-emitting element 30 so that some of the semiconductor layers included in the light-emitting element 30 may be exposed, and may thus be in contact with the contact electrodes CNE1, CNE2, but the present disclosure is not limited thereto. Alternatively, the insulating film 38 may be removed from at least part of the light-emitting element 30 so that sides of the semiconductor layers of the light-emitting element 30 may be partially exposed at both ends of the light-emitting element 30, and may thus be in direct contact with the contact electrodes CNE1, CNE2.

A second insulating layer PAS2 may be located on part of the light-emitting element 30. For example, the second insulating layer PAS2 may be located on the light-emitting element 30, and may have a smaller width than the light-emitting element 30, and may thus partially surround the light-emitting element 30 while exposing both ends of the light-emitting element 30. The second insulating layer PAS2 may initially be located to cover the light-emitting element 30, the electrodes 21, 22, and the first insulating layer PAS1 during the fabrication of the display device 10, and then may be partially removed to expose both ends of the light-emitting element 30. The second insulating layer PAS2 may be located over the first insulating layer PAS1 to extend in the second direction DR2, and may thus form a linear or island pattern in each subpixel PXn. The second insulating layer PAS2 may protect the light-emitting element 30, and may fix the light-emitting element 30 in place during the fabrication of the display device 10.

A plurality of contact electrodes CNE1, CNE2 may be located on the second insulating layer PAS2. The contact electrodes CNE1, CNE2 may be located on the electrodes 21, 22 to extend in one direction. The contact electrodes CNE1, CNE2 may include first and second contact electrodes CNE1 and CNE2, which are located on the first and second electrodes 21 and 22, respectively. The contact electrodes CNE1, CNE2 may be located to be spaced apart from each other, and may face each other. For example, the first and second contact electrodes CNE1 and CNE2 may be located on the first and second electrodes 21 and 22, respectively, to be spaced apart from each other in the first direction DR1. The contact electrodes CNE1, CNE2 may form stripe patterns in the emission area EMA of each subpixel PXn.

The contact electrodes CNE1, CNE2 may be in contact with the light-emitting element 30. The first contact electrode CNE1 may be in contact with the first end of the light-emitting element 30, and the second contact electrode CNE2 may be in contact with the second end of the light-emitting element 30. The light-emitting element 30 may have semiconductor layers exposed at both ends thereof, and the contact electrodes CNE1, CNE2 may be in contact with, and electrically connected to, the exposed semiconductor layers of the light-emitting element 30. First sides of the contact electrodes CNE1, CNE2 that are in contact with both ends of the light-emitting element 30 may be located on the second insulating layer PAS2. Also, the first contact electrode CNE1 may be in contact with the first electrode 21 via an opening OP that exposes part of the top surface of the first electrode 21, and the second contact electrode CNE2 may be in contact with the second electrode 22 via an opening OP that exposes part of the top surface of the second electrode 22.

The widths of the contact electrodes CNE1, CNE2 may be smaller than the widths of the electrodes 21, 22. The contact electrodes CNE1, CNE2 may be located to be in contact with both ends of the light-emitting element 30, respectively, and to cover parts of the top surfaces of the first and second electrodes 21 and 22. However, the present disclosure is not limited to this. Alternatively, the contact electrodes CNE1, CNE2 may be formed to have a greater width than the electrodes 21, 22, and to cover both sides of each of the electrodes 21, 22.

The contact electrodes CNE1, CNE2 may include a transparent conductive material. For example, the contact electrodes CNE1, CNE2 may include ITO, IZO, indium tin zinc oxide (ITZO), or Al. Light emitted from the light-emitting element 30 may travel toward the electrodes 21, 22 through the contact electrodes CNE1, CNE2, but the present disclosure is not limited thereto.

Two contact electrodes CNE1, CNE2 are illustrated as being provided in one subpixel PXn, but the present disclosure is not limited thereto. The number of contact electrodes CNE1, CNE2 provided in each subpixel PXn may vary depending on the number of electrodes 21, 22 provided in each subpixel PXn.

A third insulating layer PAS3 may be located on the entire surface of the display area DPA of the first substrate 11. The third insulating layer PAS3 may protect elements located on the first substrate 11 from an external environment. The third insulating layer PAS3 may be omitted in other embodiments.

The first, second, and third insulating layers PAS1, PAS2, and PAS3 may include an inorganic insulating material or an organic insulating material. For example, the first, second, and third insulating layers PAS1, PAS2, and PAS3 may include an inorganic insulating material such as silicon oxide (SiOx), silicon nitride (SiNx), silicon oxynitride (SiOxNy), aluminum oxide ($Al_2O_3$), or aluminum nitride (AlN). In another example, the first, second, and third insulating layers PAS1, PAS2, and PAS3 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited to these examples.

The display element layer, which is located in the display area DPA, may include the first electrode 21, the second electrode 22, the light-emitting element 30, and the contact electrodes CNE1, CNE2, and may thus emit light of a given wavelength range. In the pad area PDA, an external device EXD for transmitting driving signals for driving each subpixel PXn may be mounted. The external device EXD may be connected to the wire pad WPD in the pad area PDA, and the wire pad WPD may be electrically connected to the external device EXD via the pad electrode PAD_R, PAD_C, which is located above the wire pad WPD. The wire pad WPD and the pad electrode PAD_R, PAD_C in the pad area PDA will hereinafter be described.

The wire pad WPD is located on the second interlayer insulating layer 17 and in the pad area PDA. The wire pad WPD may be located on the same layer as the second data conductive layer. The pad electrode PAD_R, PAD_C is located on the wire pad WPD. The pad electrode PAD_R, PAD_C may include a pad electrode base layer PAD_R, which is located on the wire pad WPD, and a pad electrode upper layer PAD_C, which is located on the pad electrode base layer PAD_R.

The pad electrode base layer PAD_R may be located directly on the wire pad WPD. In some embodiments, the pad electrode base layer PAD_R may be located to cover and thereby cap the wire pad WPD. For example, the pad electrode base layer PAD_R may be formed to have a greater width than the wire pad WPD, and may be in direct contact with the top surface and the sides of the wire pad WPD. Parts of the bottom surface of the pad electrode base layer PAD_R may be located directly on the same layer as the wire pad WPD (e.g., on the second interlayer insulating layer 17).

The pad electrode base layer PAD_R may be formed by the same process, and may thus include the same material, as the electrodes 21, 22 in the display area DPA. The electrodes 21, 22 may be formed in the display area DPA after the formation of the first banks BNL1. The first planarization layer 19 and the first banks BNL1 might not be located in the pad area PDA, and subsequent processes of the fabrication of the display device 10 may be performed with the wire pad WPD exposed. The pad electrode base layer PAD_R may be formed by the same process as that for forming the electrodes 21, 22, and may be located to cover the wire pad WPD.

The wire pad WPD may be located in the same layer, and may include the same metallic material (e.g., Cu), as the second data conductive layer. The electrodes 21, 22 and the pad electrode base layer PAD_R may include a metallic material with high reflectance such as, for example, Al. The pad electrode base layer PAD_R and the pad electrode upper layer PAD_C may electrically connect the external device EXD and the wire pad WPD, and may cap the wire pad WPD to reduce or prevent damage that may otherwise occur to the wire pad WPD in subsequent processes.

The first insulating layer PAS1 may be located even in the pad area PDA. The first insulating layer PAS1 may be located on the pad electrode base layer PAD_R to mostly cover the pad electrode base layer PAD_R, and may include a pad opening OP_P that exposes part of the top surface of the pad electrode base layer PAD_R. In some embodiments, the first insulating layer PAS1 may be located to have a greater width than the pad electrode base layer PAD_R to be in contact with the sides of the pad electrode base layer PAD_R, and to have parts of the bottom surface thereof located directly on the same layer as the wire pad WPD (e.g., on the second interlayer insulating layer 17).

The pad electrode upper layer PAD_C is located on the first insulating layer PAS1. The pad electrode upper layer PAD_C may be located to cover the pad opening OP_P of the first insulating layer PAS1, and may be in direct contact with part of the top surface of the pad electrode base layer PAD_R that is exposed by the pad opening OP_P. The pad electrode upper layer PAD_C may have a smaller width than the pad electrode base layer PAD_R, and may cover the pad opening OP_P. The pad electrode upper layer PAD_C may form the pad electrode together with the pad electrode base layer PAD_R, and may electrically connect the external device EXD and the wire pad WPD. The external device EXD may be connected to the pad electrode upper layer PAD_C via a conductive material such as a conductive ball.

In some embodiments, the pad electrode upper layer PAD_C may be formed by the same process, and may include the same material, as the contact electrodes CNE1, CNE2 in the display area DPA. The contact electrodes CNE1, CNE2 may be formed in the display area DPA after the formation of the first insulating layer PAS1. The first insulating layer PAS1 may be located on the entire surfaces of the display area DPA and the pad area PDA to cover the electrodes 21, 22 and the pad electrode base layer PAD_R. The pad electrode upper layer PAD_C may be formed on the pad electrode base layer PAD_R by the same process as the contact electrodes CNE1, CNE2, and as a result, the number of processes for forming the pad electrode PAD_R, PAD_C can be reduced. In some embodiments, the pad electrode upper layer PAD_C, like the contact electrodes CNE1, CNE2, may include ITO, IZO, ITZO, or Al. Some layers in the display area DPA and the pad area PDA of the display device 10 may be formed at the same time by merging some processes of the fabrication of the display device 10. Because the pad electrode PAD_R, PAD_C is formed in the pad area PDA using some of the layers located in the display element layer of the display area DPA, the fabrication of the display device 10, such as processes that follow the formation of the circuit layer, can be simplified.

In some embodiments, in the pad area PDA, only the first insulating layer PAS1 may be located between the pad electrode base layer PAD_R and the pad electrode upper layer PAD_C, and thus, height differences that may be caused by the insulating layers PAS1, PAS2, and PAS3 may be reduced or minimized. In the display area DPA, the light-emitting element 30 and the second insulating layer PAS2 may be located on the first insulating layer PAS1, and relatively large height differences may be generated between the contact electrodes CNE1, CNE2 and the electrodes 21, 22 at both ends of the light-emitting element 30. On the contrary, because the first insulating layer PAS1, which includes a different material from the second insulating layer PAS2, and the pad electrode base layer PAD_R are located in the pad area PDA, while the light-emitting element 30 is not located in the pad area PDA, other insulating layers can be selectively removed from the pad area PDA without a requirement of a separate mask. In some embodiments, unlike in the display area DPA, the second insulating layer PAS2 and the second bank BNL2 may not be located in the pad area PDA, and instead only the first insulating layer PAS1 may be located between the pad electrode base layer PAD_R and the pad electrode upper layer PAD_C.

In the pad area PDA, a plurality of insulating layers may be omitted, and instead only the wire pad WPD, the pad electrode PAD_R, PAD_C, and the first insulating layer PAS1 may be located. Thus, the height difference between the pad electrode base layer PAD_R and the pad electrode upper layer PAD_C can be reduced or minimized. In some embodiments, the thickness of the first insulating layer PAS1 and the height difference between the pad electrode base layer PAD_R and the pad electrode upper layer PAD_C may be about 0.2 μm to about 0.6 μm, for example, about 0.3 μm. Accordingly, any bonding defect associated with the external device EXD, which is located on the pad electrode upper layer PAD_C, can be reduced or prevented.

The cut part CP, in which the electrodes 21, 22 are separated in the second direction DR2, may be formed in the cut area CBA. The electrode on the first planarization layer 19 (e.g., the second electrode 22 of FIG. 6), and the first insulating layer PAS1, which covers the second electrode 22, may be located in the cut area CBA. The electrodes 21, 22 may initially be formed to extend in the second direction DR2 across a plurality of subpixels PXn, and may then be separated from one subpixel PXn to another subpixel PXn after the arrangement of the light-emitting element 30 in each subpixel PXn. As the light-emitting element 30 that is arranged in each subpixel PXn and the second insulating layer PAS2, which fixes the location of the light-emitting element 30, are formed, the electrodes 21, 22 may be separated between each pair of adjacent subpixels PXn in the second direction DR2 so that each subpixel PXn can be driven separately. The second bank BNL2 and the second insulating layer PAS2 are omitted from the cut area CBA, while the electrodes 21, 22 and the first insulating layer PAS1, which covers the electrodes 21, 22, are located in the cut area CBA. After the arrangement of the second insulating layer PAS2, a process of dividing the electrodes 21, 22 that extend in the second direction DR2 may be performed so that the electrodes 21, 22 may be separated between each pair of adjacent subpixels PXn in the second direction DR2 by the cut part CP. FIG. 6 illustrates that only the second electrode 22 is separated by the cut part CP, but the first electrode 21 may also be separated by the cut part CP. The first insulating layer PAS1, which is located on the electrodes 21, 22, and the electrodes 21, 22 may be patterned at the same time, and cut surfaces of the first insulating layer PAS1 may be aligned with cut surfaces of the electrodes 21, 22.

In the cut area CBA, a gate wire WL_G, which is located in the first gate conductive layer, and first and second data wires WL_SD1 and WL_SD2, which are located in the first and second data conductive layers, respectively, may be further located below the first planarization layer 19. The gate wire WL_G, the first data wire WL_SD1, and the second data wire WL_SD2 may be parts of wires that are connected to each subpixel PXn, for example, a scan line SCL, a sensing line SSL, a data line DTL, or voltage lines VL1, VL2, but the present disclosure is not limited thereto. Alternatively, wires may be omitted from the cut area CBA in other embodiments.

In the display device 10, a plurality of layers, including the circuit layer and the display element layer, may be sequentially located on the first substrate 11. Some of the layers located in the display area DPA and the pad area PDA can be formed together by the same merged process(es), and as a result, the fabrication of the display device 10 can be simplified. For example, because the pad electrode PAD_R, PAD_C, which includes the same material as the electrodes 21, 22 and the contact electrodes CNE1, CNE2 in the display area DPA, are provided in the pad area PDA, the wire pad WPD can be protected from subsequent processes, and a separate process of forming the pad electrode PAD_R, PAD_C for connection to the external device EXD is unnecessary. The display device 10 can have a new pad electrode structure including the light-emitting element 30 in each subpixel PXn, and the fabrication of the display device 10 can be generally simplified.

Figure 7:
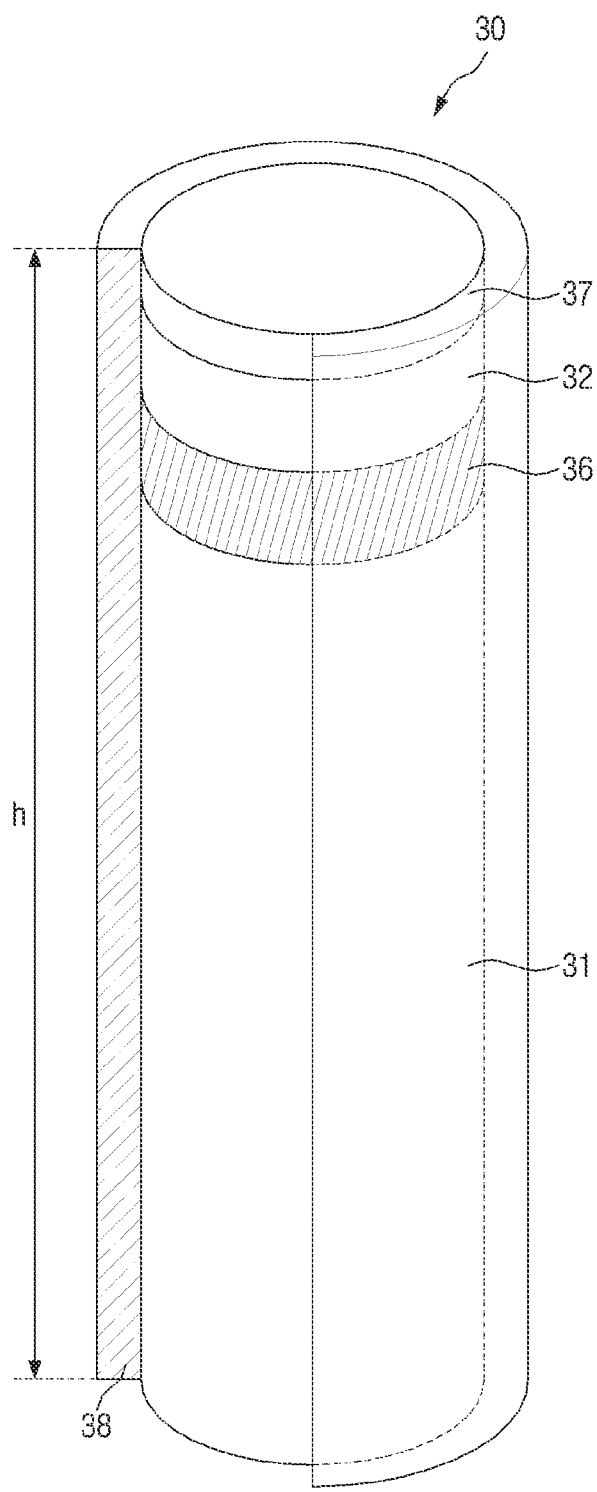
FIG. 7 is a perspective view of a light-emitting element according to some embodiments of the present disclosure.

FIG. 7 is a perspective view of a light-emitting element according to some embodiments of the present disclosure.

Referring to FIG. 7, a light-emitting element 30 may be a light-emitting diode (LED), for example, an ILED having a size of several micrometers or nanometers and formed of an inorganic material. If an electric field is formed in a given direction between two opposite electrodes, the ILED may be aligned between the two electrodes where polarities are formed. The light-emitting element 30 may be aligned by the electric field formed between the two electrodes.

The light-emitting element 30 may have a shape that extends in one direction. The light-emitting element 30 may have the shape of a cylinder, a rod, a wire, or a tube. However, the present disclosure is not limited to this. Alternatively, the light-emitting element 30 may have the shape of a polygonal column such as a regular cube, a rectangular parallelepiped, or a hexagonal column or may have a shape that extends in one direction but with a partially inclined outer surface. A plurality of semiconductors included in the light-emitting element 30 may be sequentially located or stacked in the direction in which the light-emitting element 30 extends.

The light-emitting element 30 may include semiconductor layers doped with impurities of an arbitrary conductivity type (e.g., a p-type or an n-type). The semiconductor layers may receive electrical signals from an external power source to emit light of a given wavelength range.

Referring to FIG. 7, the light-emitting element 30 may include a first semiconductor layer 31, a second semiconductor layer 32, a light-emitting layer 36, an electrode layer 37, and an insulating film 38.

The first semiconductor layer 31 may include an n-type semiconductor. For example, in a case where the light-emitting element 30 emits light of a blue wavelength range, the first semiconductor layer 31 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be one of AlGaInN, GaN, AlGaN, InGaN, AlN, and InN that are doped with an n-type dopant. The first semiconductor layer 31 may be doped with an n-type dopant, and the n-type dopant may be, for example, Si, Ge, or Sn. For example, the first semiconductor layer 31 may be n-GaN doped with n-type Si. The first semiconductor layer 31 may have a length of about 1.5 μm to about 5 μm, but the present disclosure is not limited thereto.

The second semiconductor layer 32 is located on the light-emitting layer 36. The second semiconductor layer 32 may include a p-type semiconductor. For example, in a case where the light-emitting element 30 emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be one of AlGaInN, GaN, AlGaN, InGaN, AlN, and InN that are doped with a p-type dopant. The second semiconductor layer 32 may be doped with a p-type dopant, and the p-type dopant may be, for example, Mg, Zn, Ca, Se, or Ba. For example, the second semiconductor layer 32 may be p-GaN doped with p-type Mg. The second semiconductor layer 32 may have a length of about 0.05 μm to about 0.10 μm, but the present disclosure is not limited thereto.

The first and second semiconductor layers 31 and 32 are illustrated as being formed as single-layer films, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 is located between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. For example, in a case where the light-emitting layer 36 emits light of a blue wavelength range, the quantum layers may include a material such as AlGaN or AlGaInN. For example, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. In a case where the light-emitting layer 36 includes AlGaInN as its quantum layer(s) and AlInN as its well layer(s), the light-emitting layer 36 can emit blue light having a central wavelength range of about 450 nm to about 495 nm.

However, the present disclosure is not limited to this. Alternatively, the light-emitting layer 36 may have a structure in which a semiconductor material having a large band gap energy and a semiconductor material having a small band gap energy are alternately stacked or may include group III or group V semiconductor materials depending on the wavelength of light to be emitted. The type of light emitted by the light-emitting layer 36 is not particularly limited. The light-emitting layer 36 may emit light of a red or green wavelength range as suitable, instead of blue light.

The light-emitting layer 36 may have a length of about 0.05 µm to about 0.10 µm, but the present disclosure is not limited thereto.

Light may be emitted not only from the circumferential surface, in a length direction, of the light-emitting element 30, but also from both sides of the light-emitting element 30. The directionality of the light emitted from the light-emitting layer 36 is not particularly limited.

The electrode layer 37 may be an ohmic contact electrode, but the present disclosure is not limited thereto. Alternatively, the electrode layer 37 may be a Schottky contact electrode. The light-emitting element 30 may include at least one electrode layer 37. FIG. 7 illustrates that the light-emitting element 30 includes one electrode layer 37, but the present disclosure is not limited thereto. Alternatively, the light-emitting element 30 may include more than one electrode layer 37, or the electrode layer 37 may be omitted. However, the following description of the light-emitting element 30 may be directly applicable to a light-emitting element 30 having more than one electrode layer 37 or having a different structure from the light-emitting element 30 of FIG. 7.

The electrode layer 37 may reduce the resistance between the light-emitting element 30 and electrodes (or contact electrodes) when the light-emitting element 30 is electrically connected to the electrodes (or the contact electrodes). The electrode layer 37 may include a conductive metal. For example, the electrode layer 37 may include at least one of Al, Ti, In, Au, Ag, ITO, IZO, and ITZO. Also, the electrode layer 37 may include a semiconductor material doped with an n-type or p-type dopant. The electrode layer 37 may include the same material or different materials, but the present disclosure is not limited thereto.

The insulating film 38 is located to surround the first and second semiconductor layers 31 and 32 and the electrode layer 37. For example, the insulating film 38 may be located to surround at least the light-emitting layer 36, and may extend in the direction in which the light-emitting element 30 extends. The insulating film 38 may protect the first semiconductor layer 31, the light-emitting layer 36, the second semiconductor layer 32, and the electrode layer 37. The insulating film 38 may be formed to surround the sides of the first semiconductor layer 31, the light-emitting layer 36, the second semiconductor layer 32, and the electrode layer 37, but to expose both ends, in the length direction, of the light-emitting element 30.

The insulating film 38 is illustrated as being formed to extend in the length direction of the light-emitting element 30 and to cover the sides of the first semiconductor layer 31, the light-emitting layer 36, the second semiconductor layer 32, and the electrode layer 37, but the present disclosure is not limited thereto. The insulating film 38 may cover the sides of only the light-emitting layer 36 and some of the first and second semiconductor layers 31 and 32, or may cover only part of the side of the electrode layer 37 so that the side of the electrode layer 37 may be partially exposed. The insulating film 38 may be formed to be rounded in a cross-sectional view, in a region adjacent to at least one end of the light-emitting element 30.

The insulating film 38 may have a thickness of about 10 nm to about 1.0 µm, but the present disclosure is not limited thereto. For example, the insulating film 38 may have a thickness of about 40 nm.

The insulating film 38 may include a material with insulating properties such as, for example, silicon oxide (SiOx), silicon nitride (SiNx), silicon oxynitride (SiOxNy), aluminum nitride (AlN), or aluminum oxide ($Al_2O_3$).

Accordingly, the insulating film 38 can reduce or prevent any short circuit that may occur when the light-emitting layer 36 is placed in direct contact with electrodes that transmit electrical signals (e.g., directly) to the light-emitting element 30. Also, because the insulating film 38 includes the light-emitting layer 36 to protect the outer surface of the light-emitting element 30, any degradation in the emission efficiency of the light-emitting element 30 can be reduced or prevented.

The outer surface of the insulating film 38 may be subjected to surface treatment. The light-emitting element 30 may be sprayed on electrodes while being scattered in predetermined ink. Here, the surface of the insulating film 38 may be hydrophobically or hydrophilically treated to keep the light-emitting element 30 scattered in ink without agglomerating with other neighboring light-emitting elements 30.

A length h of the light-emitting element 30 may be in the range of about 1 µm to about 10 µm, or about 2 µm to about 6 µm, for example, about 3 µm to about 5 µm. The light-emitting element 30 may have a diameter of about 30 nm to about 700 nm, and may have an aspect ratio of about 1.2 to about 100, but the present disclosure is not limited thereto. A plurality of light-emitting elements 30 included in the display device 10 may have different diameters depending on the composition of their respective light-emitting layers 36. For example, the light-emitting element 30 may have a diameter of about 500 nm.

A method of fabricating the display device 10 will hereinafter be described.

FIGS. 8 through 19 are cross-sectional views illustrating a method of fabricating a display device according to some embodiments of the present disclosure. It will hereinafter be described how to form each layer in the display area DPA and the pad area PDA.

Figure 8:
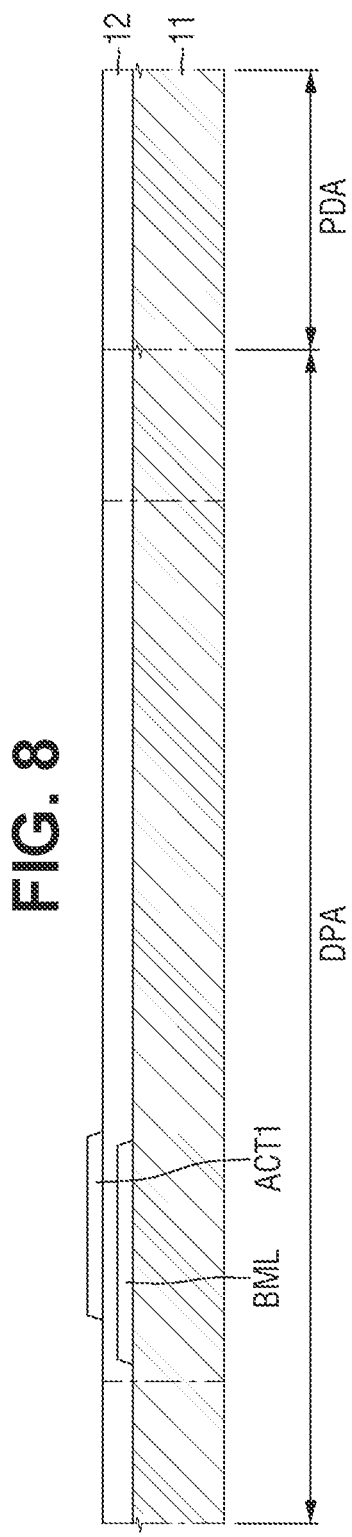
FIGS. 8 through 19 are cross-sectional views illustrating a method of fabricating a display device according to some embodiments of the present disclosure.

Referring to FIG. 8, the light-blocking layer BML is formed on the first substrate 11, and the buffer layer 12 and the semiconductor layer are formed on the light-blocking layer BML. The light-blocking layer BML may be formed by a mask process. For example, a material layer for forming the light-blocking layer BML may be deposited on the entire surface of the first substrate 11, and then may be patterned, thereby obtaining the light-blocking layer BML of FIG. 8.

The buffer layer 12 may be formed by depositing a material layer for forming the buffer layer 12 on the entire surface of the first substrate 11, and the semiconductor layer may include the active layer ACT1 of the first transistor T1, and may be formed by a mask process. For example, an oxide semiconductor may be deposited on the entire surface of the buffer layer 12, and may be patterned via photolithography, thereby obtaining the active layer ACT1 of FIG. 8. Layers in the display area DPA and the pad area PDA all may be formed in a similar manner to that described above, and thus, detailed descriptions of how to form layers in the display area DPA and the pad area PDA will be omitted, or at least simplified. Instead, the order in which to form layers in the display area DPA and the pad area PDA will hereinafter be described in detail.

Figure 9:
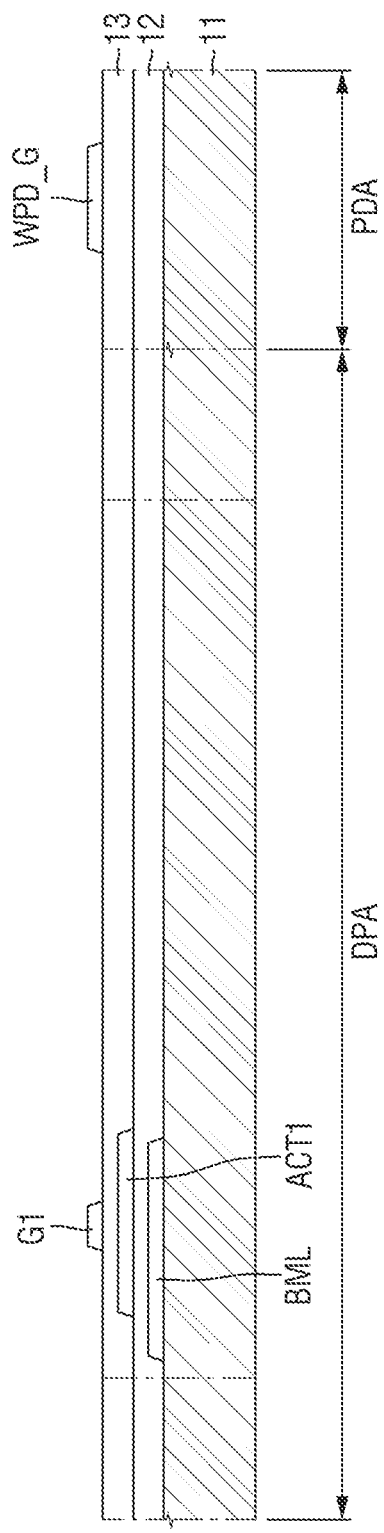

Thereafter, referring to FIG. 9, the first gate insulating layer 13 and a gate conductive layer, which is located on the first gate insulating layer 13, are formed on the buffer layer 12 with the semiconductor layer formed thereon. The gate conductive layer may include the gate electrode G1, which is located in the display area DPA, and the gate pad WPD_G, which is located in the pad area PDA. The first gate insulating layer 13 may be formed by depositing a material layer for forming a gate insulating layer on the entire surface of the first substrate 11, and the gate conductive layer may be formed by a mask process.

Figure 10:
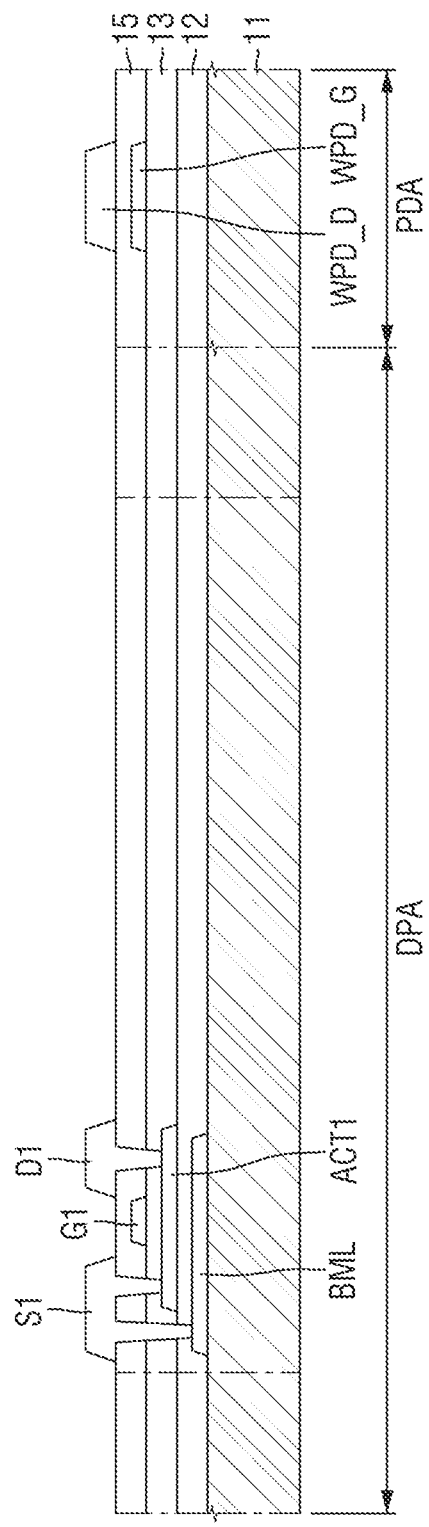

Thereafter, referring to FIG. 10, the first interlayer insulating layer 15 is formed on the first gate insulating layer 13 with the gate conductive layer formed thereon, and contact holes that expose parts of the light-blocking layer BML and the semiconductor layer are formed. The first interlayer insulating layer 15 may be formed by depositing a material layer for forming an interlayer insulating layer on the entire surface of the first gate insulating layer 13, and the contact holes may be formed by a mask process.

Thereafter, the first data conductive layer is formed on the first interlayer insulating layer 15 with the contact holes formed therein. The first data conductive layer may be formed by a mask process. The first data conductive layer may include the source electrode S1 and the drain electrode D1, which are located in the display area DPA, and the data pad WPD_D, which is located in the pad area PDA. In the display area DPA, the first data conductive layer may be deposited even on the inside of the contact holes of the first interlayer insulating layer 15, and may thus be connected to the light-blocking layer BML or the active layer ACT1.

Figure 11:
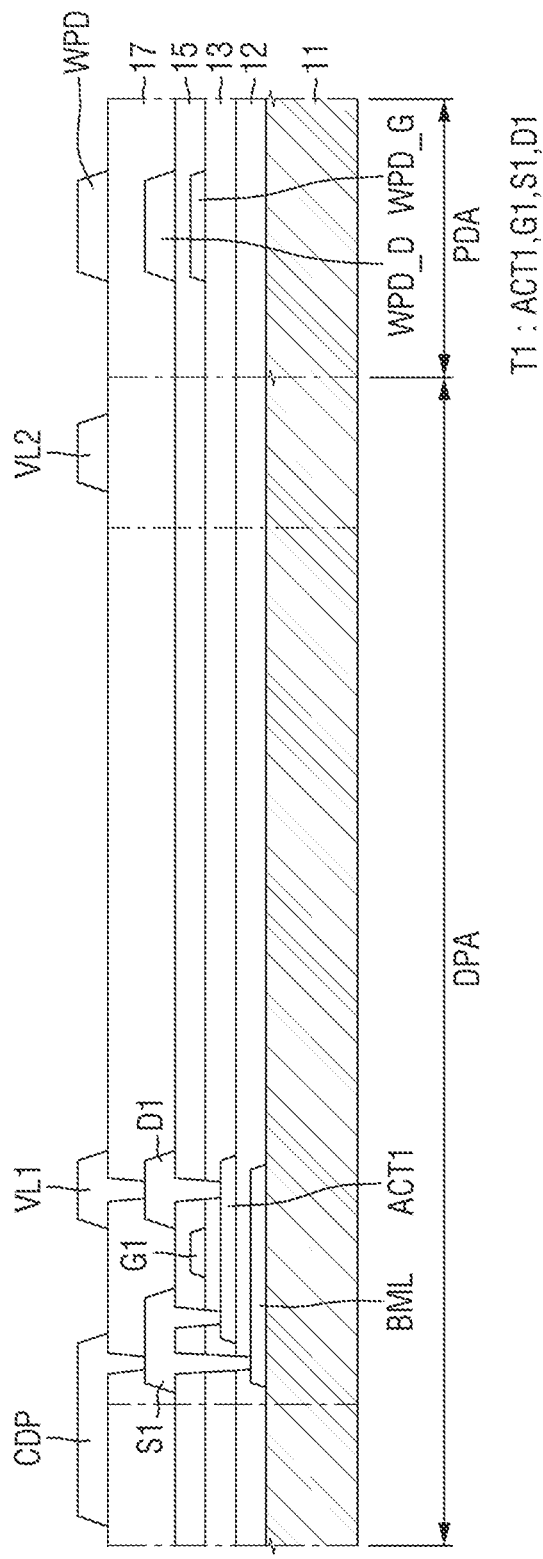

Thereafter, referring to FIG. 11, the second interlayer insulating layer 17 is formed on the first interlayer insulating layer 15 with the first data conductive layer formed thereon, and contact holes that expose parts of the first data conductive layer are formed. The second interlayer insulating layer 17 and the contact holes of the second interlayer insulating layer 17 may be formed in the same manner as the first interlayer insulating layer 15 and the contact holes of the first interlayer insulating layer 15, respectively.

Thereafter, the second data conductive layer is formed on the second interlayer insulating layer 17 with the contact holes formed therein. The second data conductive layer may be formed by a mask process. The second data conductive layer may include the voltage lines VL1, VL2 and the first conductive pattern CDP, which are located in the display area DPA, and the wire pad WPD, which is located in the pad area PDA. In the display are DPA, the second data conductive layer may be deposited even on the inside of the contact holes of the second interlayer insulating layer 17, and may thus be connected to the first data conductive layer.

Figure 12:
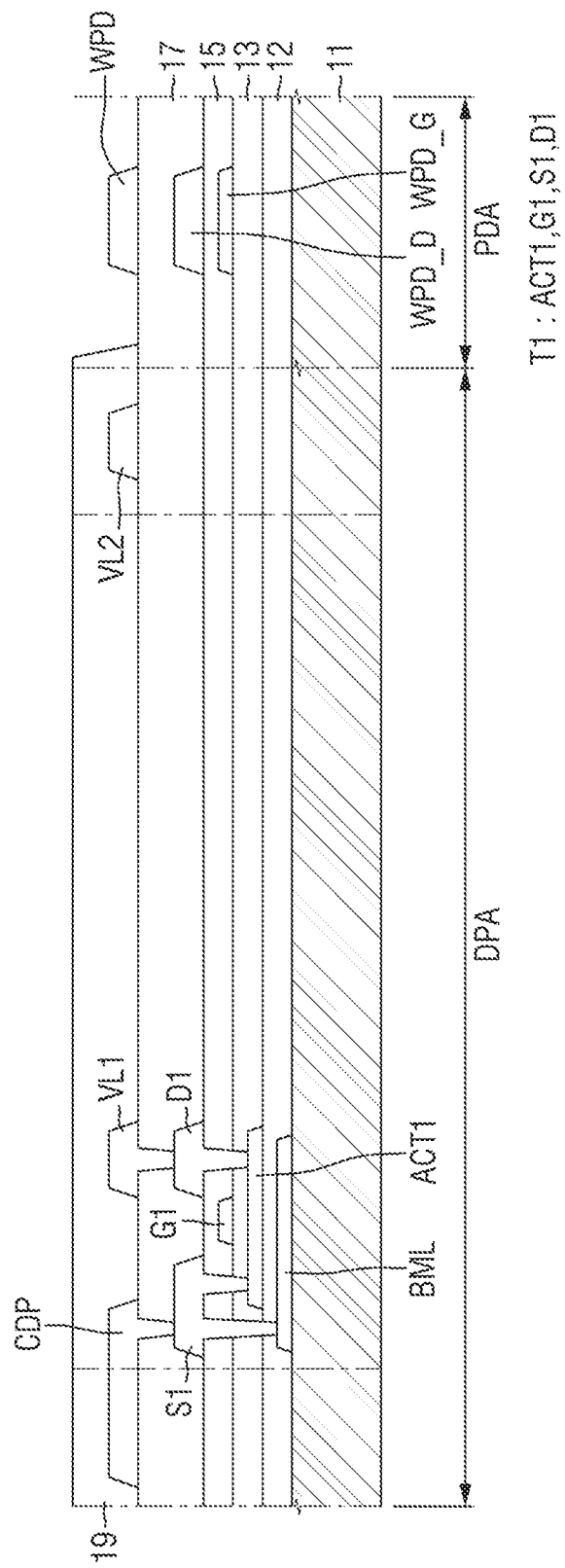
Figure 13:
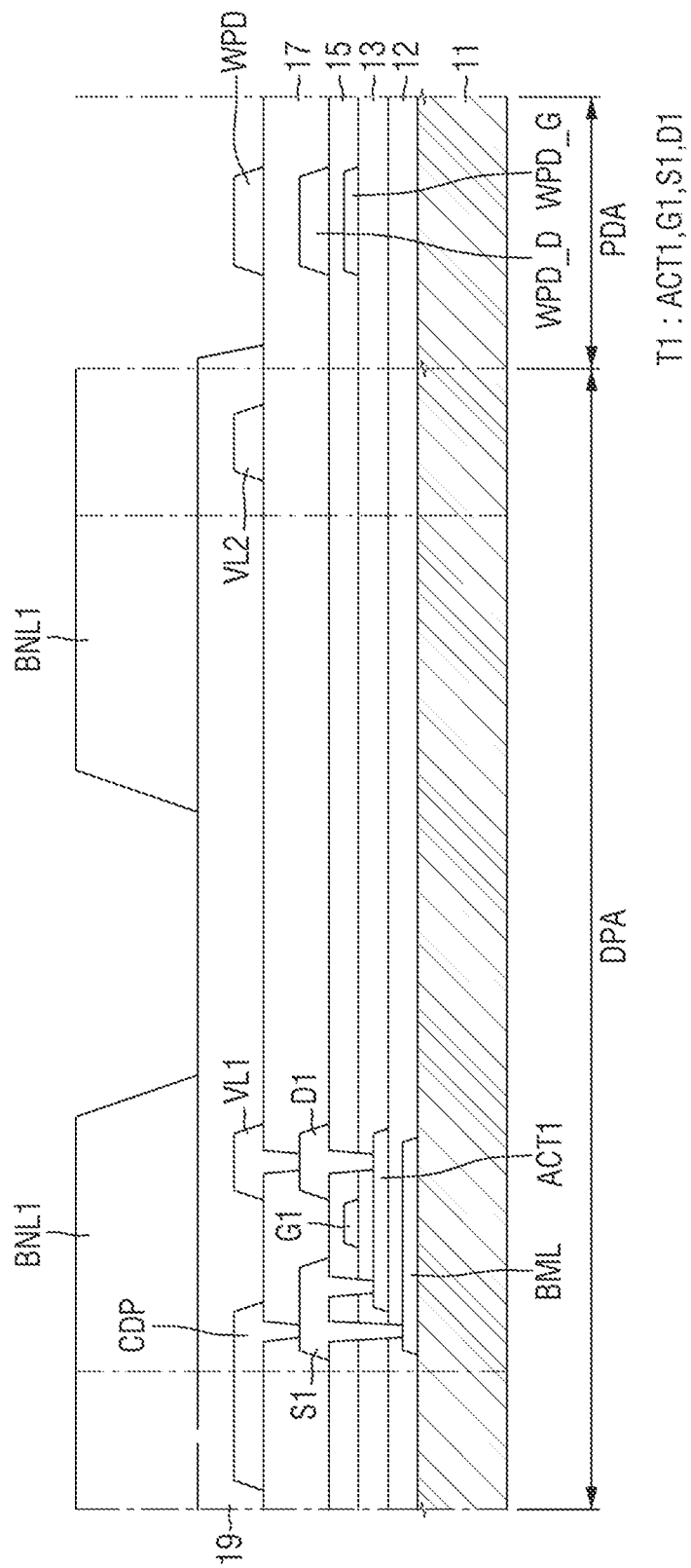

Thereafter, referring to FIGS. 12 and 13, the first planarization layer 19 is formed on the second interlayer insulating layer 17 with the second data conductive layer formed thereon, and the first banks BNL1 are formed on the first planarization layer 19. The first planarization layer 19 and the first banks BNL1 may include an organic material that contains a photosensitive material and may be formed by applying an organic material layer and subjecting the organic material layer to exposure and development. The first planarization layer 19 and the first banks BNL1 are illustrated as being separate and being formed by separate processes, but the present disclosure is not limited thereto. Alternatively, the first planarization layer 19 and the first banks BNL1 may include the same material and may be integrally formed by a single process, in which case, the first planarization layer 19 and the first banks BNL1, which have a different height from the first planarization layer 19, may be formed using a halftone mask or a slit mask.

The first planarization layer 19 and the first banks BNL1 may be located to expose the wire pad WPD in the pad area PDA. The first planarization layer 19 and the first banks BNL1 may be omitted from the pad area PDA because the organic material layer that forms the first planarization layer 19 and the first banks BNL1 is formed in the pad area PDA, and is completely removed from the pad area PDA. However, the present disclosure is not limited to this. Alternatively, an insulating layer may be formed on the second data conductive layer, and the organic material layer and the insulating layer may both be removed at the same time so that the wire pad WPD may be exposed in the pad area PDA. This will be described later in detail.

Figure 14:
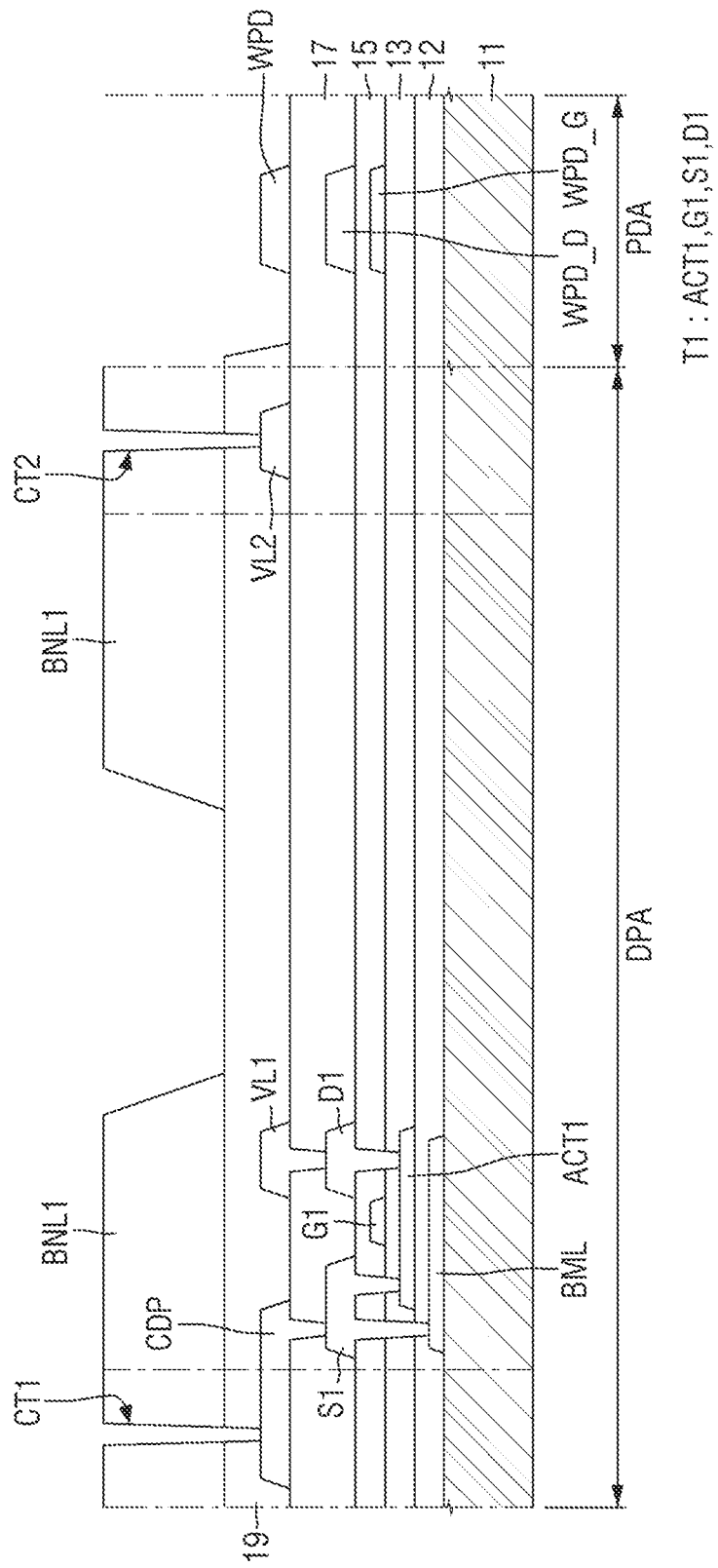
Figure 15:
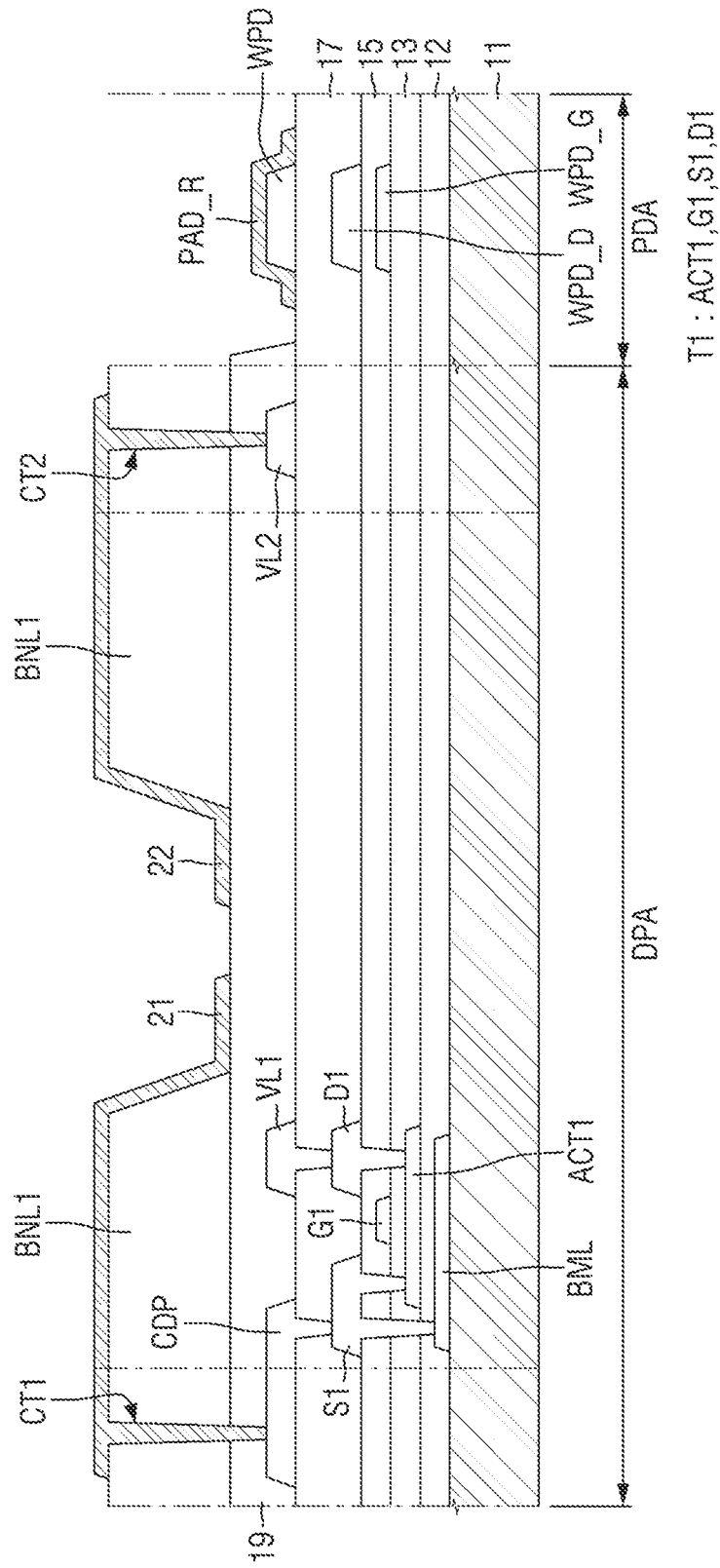

Thereafter, referring to FIGS. 14 and 15, contact holes CT1, CT2, which expose parts of the second data conductive layer, are formed to penetrate the first planarization layer 19 and the first banks BNL1, and the electrodes 21, 22, which are located above the contact holes CT1, CT2, and the pad electrode base layer PAD_R are formed. The first and second contact holes CT1 and CT2 may be formed by a mask process.

The electrodes 21, 22 and the pad electrode base layer PAD_R may be formed by a mask process. The electrodes 21, 22 and the pad electrode base layer PAD_R may be formed by depositing a material layer for forming electrodes on the entire surfaces of the first planarization layer 19, the first banks BNL1, and the pad area PDA with the second data conductive layer formed thereon, and by patterning the material layer. The material layer may be deposited even on the inside of the first and second contact holes CT1 and CT2, and the first and second electrodes 21 and 22 may be connected to the second data conductive layer.

During the patterning of the material layer for forming electrodes, the first and second electrodes 21 and 22 are formed to extend in one direction and to be spaced apart from each other, and the pad electrode base layer PAD_R is formed to have a greater width than the wire pad WPD and thus to cover the wire pad WPD. The electrodes 21, 22 in the display area DPA and the pad electrode base layer PAD_R in the pad area PDA may be formed by the same process, and may include the same material. Because the pad electrode base layer PAD_R in the pad area PDA can be formed together with the display element layer in the display area DPA, a separate mask process for forming the pad area PDA may be unnecessary.

Figure 16:
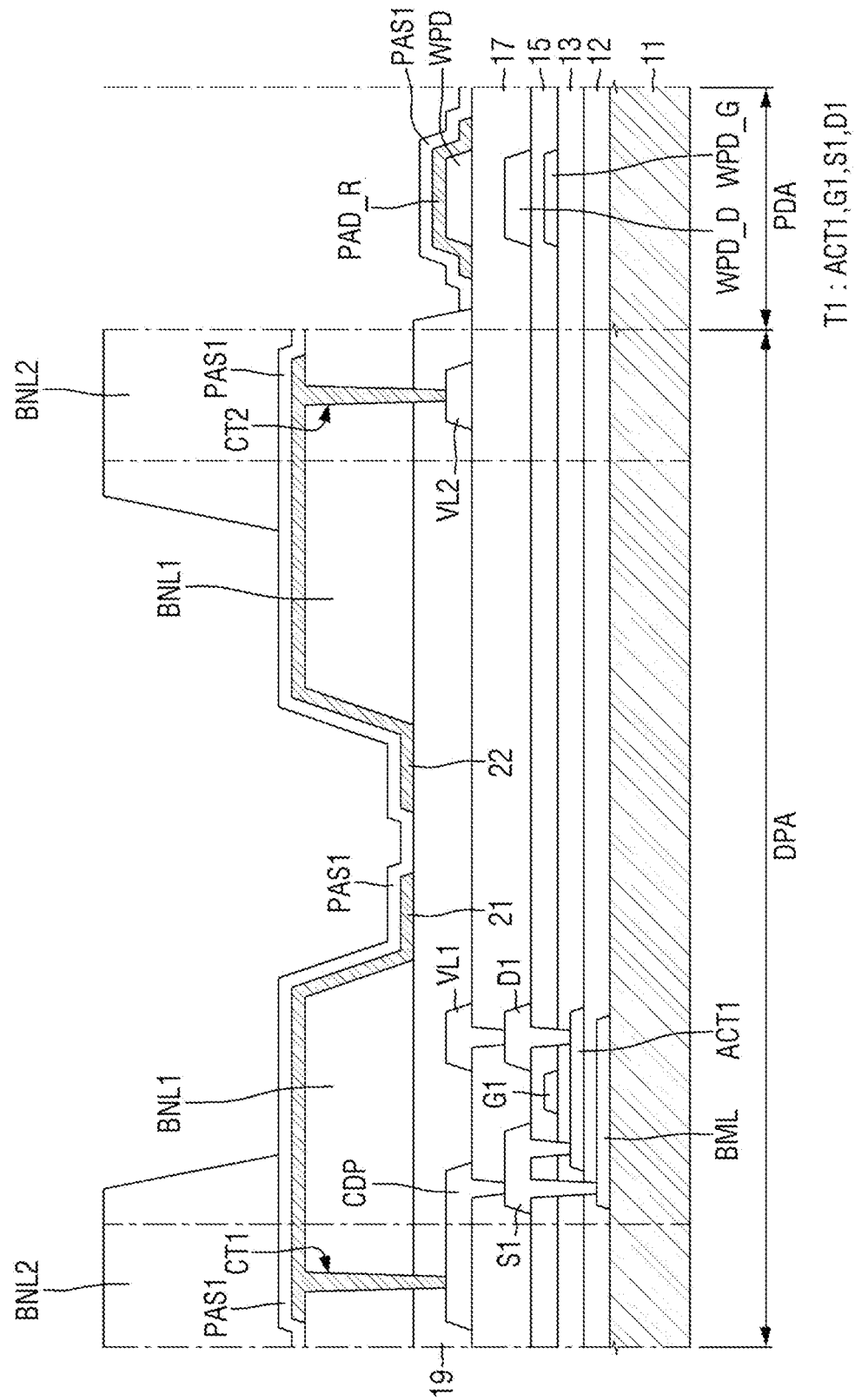

Thereafter, referring to FIG. 16, the first insulating layer PAS1 is formed on the electrodes 21, 22 and the pad electrode base layer PAD_R, and the second bank BNL2 is formed on the first insulating layer PAS1, in the display area DPA. The first insulating layer PAS1 may be formed by depositing an insulating material layer on the entire surface of the display area DPA and the entire surface of the pad area PDA. FIG. 16 illustrates that openings OP, OP_P are yet to be formed in the first insulating layer PAS1. The openings OP, OP_P may be formed after the formation of the second insulating layer PAS2. The first insulating layer PAS1 may be located to cover the pad electrode base layer PAD_R in the pad area PDA, and may reduce or prevent at least the wire pad WPD from being damaged by materials from a mask process for forming the second bank BNL2 or the second insulating layer PAS2. The wire pad WPD may be protected by the first insulating layer PAS1 and the pad electrode base layer PAD_R during the rest of the fabrication of the display device 10.

The second bank BNL2 may be located on the first insulating layer PAS1, and may be formed by the same process as the first banks BNL1. Parts of the second bank BNL2 may be located on the first banks BNL1 and may be formed to be higher than the first bank BNL1.

Figure 17:
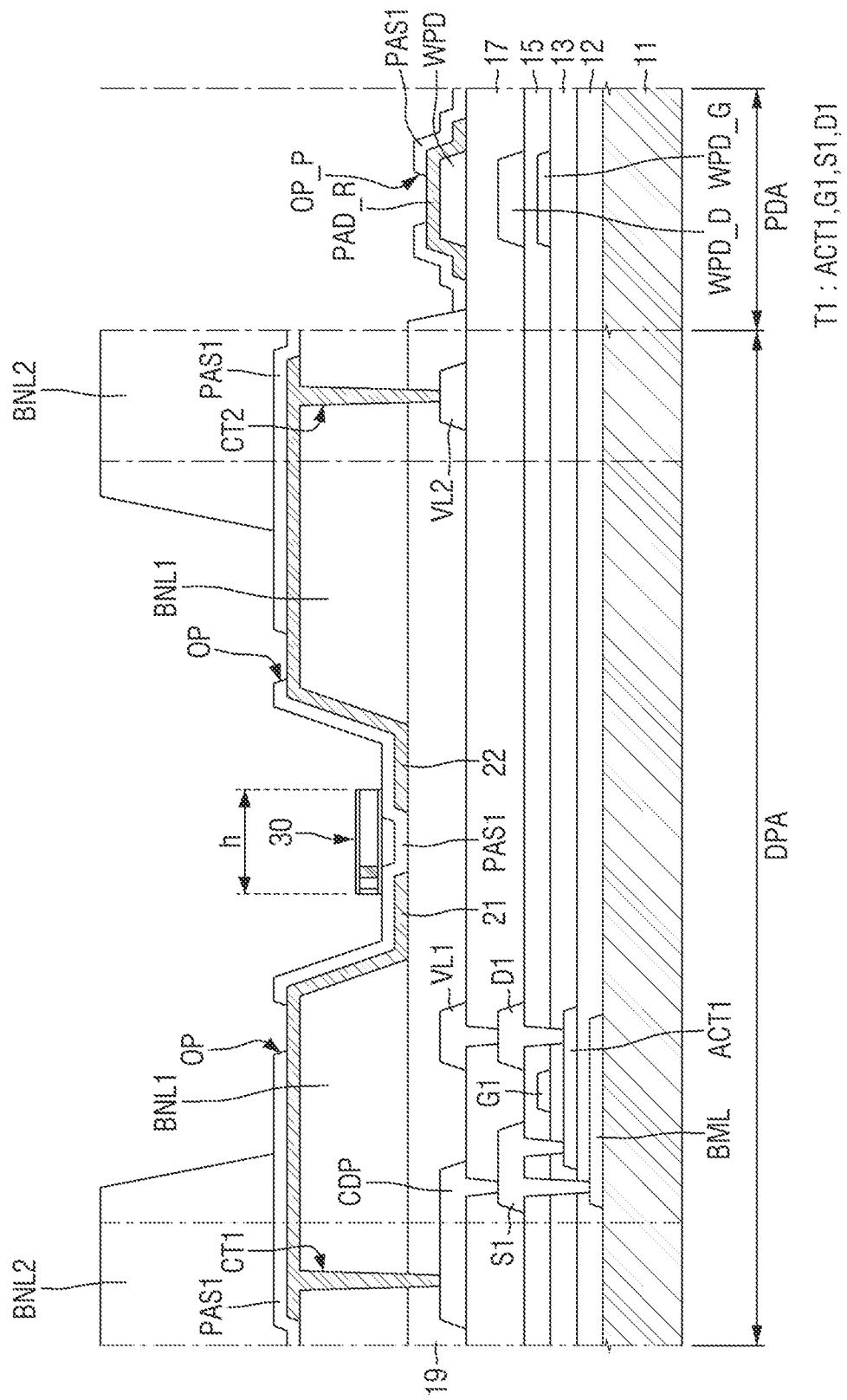

Thereafter, referring to FIG. 17, at least one light-emitting element 30 is located on the first insulating layer PAS1 in the display area DPA. In some embodiments, the light-emitting element 30 may be arranged on the electrodes 21, 22 by an inkjet printing process that sprays ink having the light-emitting element 30 scattered therein onto the electrodes 21, 22. The sprayed ink may settle in an area surrounded by the second bank BNL2. The second bank BNL2 may reduce or prevent the ink that otherwise would be spilt over to other neighboring subpixels PXn.

Once the ink including the light-emitting element 30 is sprayed, the light-emitting element 30 is arranged on the first insulating layer PAS1 by applying electrical signals to the electrodes 21, 22. If electrical signals are applied to the electrodes 21, 22, an electric field may be generated on the electrodes 21, 22. The light-emitting element 30 scattered in the ink may receive a dielectrophoretic force from the electric field, and then may settle on the first insulating layer PAS1 as its alignment direction and location change. Here, the length h of the light-emitting element 30 may be greater than the distance between the first and second electrodes 21 and 22, and both ends of the light-emitting element 30 may be located on the first and second electrodes 21 and 22.

Figure 18:
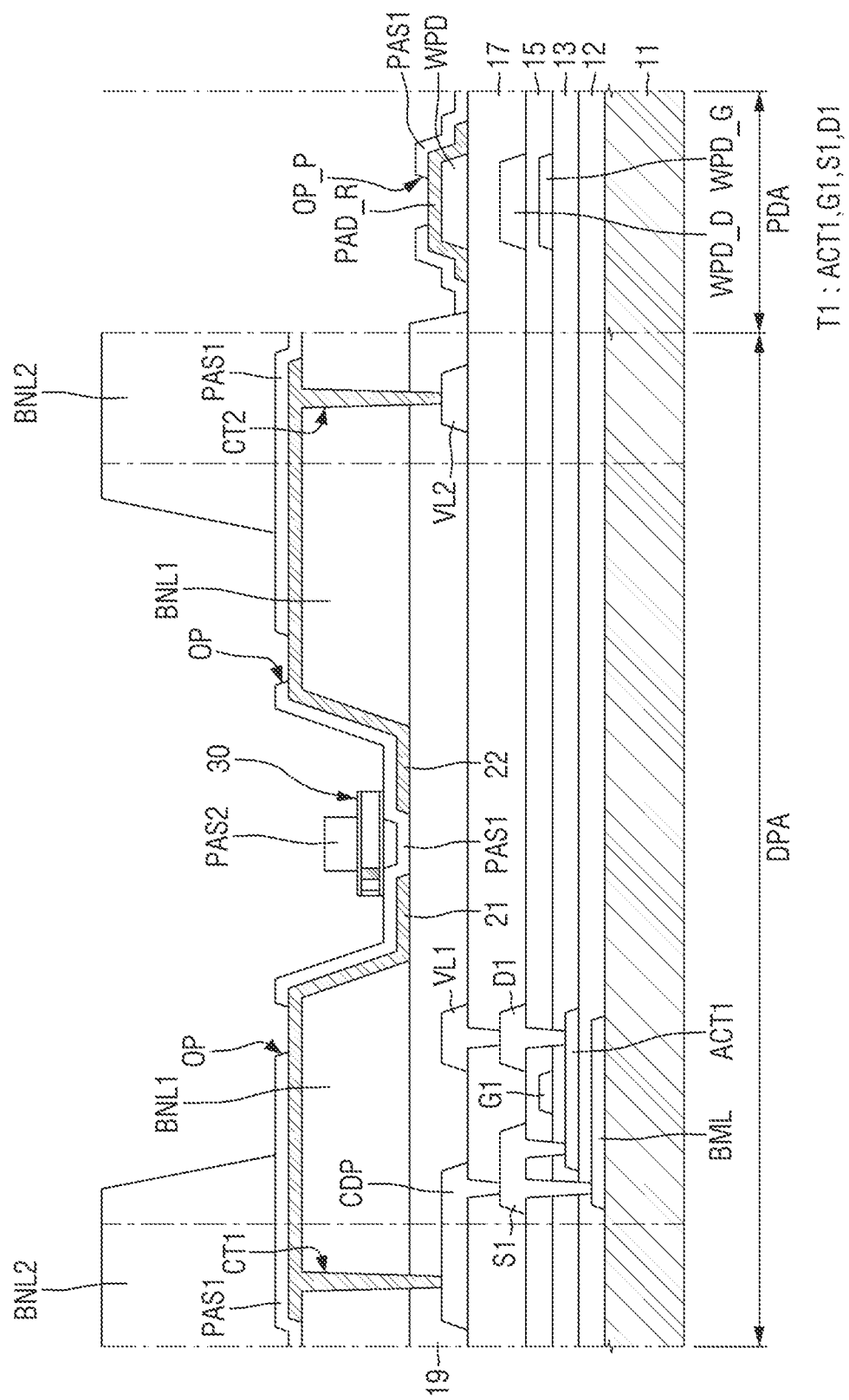

Thereafter, referring to FIG. 18, the second insulating layer PAS2, which fixes the location of the light-emitting element 30, is formed, and the openings OP, OP_P, which expose parts of the top surfaces of the electrodes 21, 22 and part of the top surface of the pad electrode base layer PAD_R, are formed by partially patterning the first insulating layer PAS1. The second insulating layer PAS2 may be formed by depositing an insulating material layer on the entire surface of the first insulating layer PAS1, and by patterning the insulating material layer to expose both ends of the light-emitting element 30. Here, the insulating material layer might not be deposited on the pad area PDA or may be deposited on, while being completely removed from, the pad area PDA. The first and second insulating layers PAS1 and PAS2 may include different insulating materials, and the first insulating layer PAS1 might not be removed by a patterning for forming the second insulating layer PAS2.

Once the second insulating layer PAS2 is formed, the openings OP, OP_P are formed by partially removing the first insulating layer PAS1, and the electrodes 21, 22 are separated in the cut area CBA.

Figure 19:
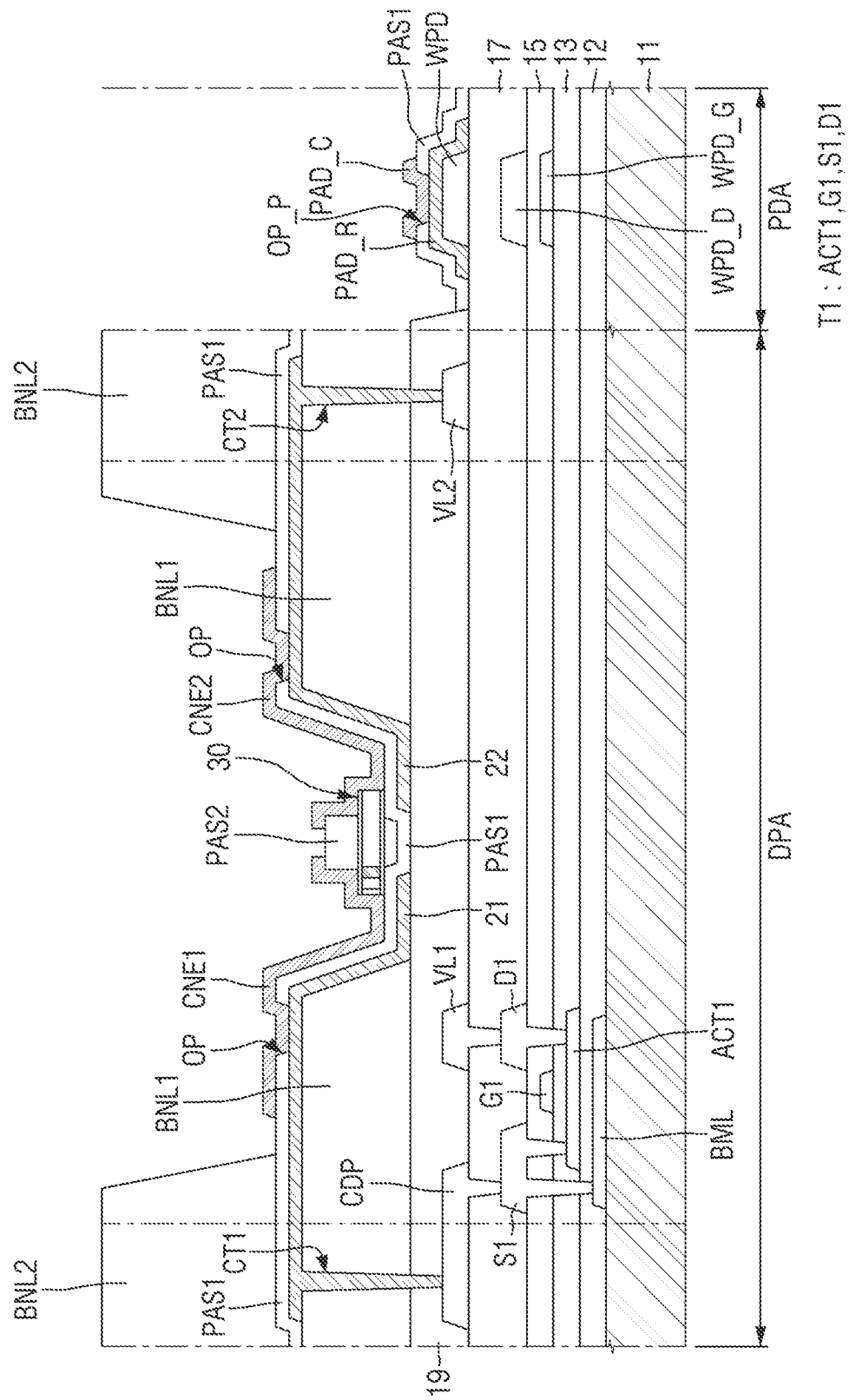

Thereafter, referring to FIG. 19, the contact electrodes CNE1, CNE2 are formed on the first and second insulating layers PAS1 and PAS2, and the pad electrode upper layer PAD_C is formed on the pad electrode base layer PAD_R. The contact electrodes CNE1, CNE2 and the pad electrode base layer PAD_R may be formed by depositing a material layer for forming contact electrodes on an entirety of the surfaces of the first and second insulating layers PAS1 and PAS2 and patterning the material layer. The material layer may be deposited even on the inside of the openings OP, OP_P of the first insulating layer PAS1, the contact electrodes CNE1, CNE2 may be connected to the electrodes 21, 22, and the pad electrode upper layer PAD_C may be connected to the pad electrode base layer PAD_R.

The contact electrodes CNE1, CNE2 in the display area DPA and the pad electrode upper layer PAD_C in the pad area PDA may be formed by the same process, and may include the same material. Because the pad electrode upper layer PAD_C in the pad area PDA can be formed together with the display element layer in the display area DPA, a separate mask process for forming the pad area PDA may be unnecessary.

Thereafter, in some embodiments, the third insulating layer PAS3 is formed on the entire surface of the first substrate 11 to fabricate the display device 10. The third insulating layer PAS3 may be omitted.

As already mentioned above, a separate mask process for forming the pad electrode PAD_R, PAD_C, which is located on the wire pad WPD, is unnecessary. Thus, because a separate mask process for forming the pad area PDA is unnecessary, the efficiency of the fabrication of the display device 10 can be improved.

Display devices according to other embodiments of the present disclosure will hereinafter be described.

Figure 20:
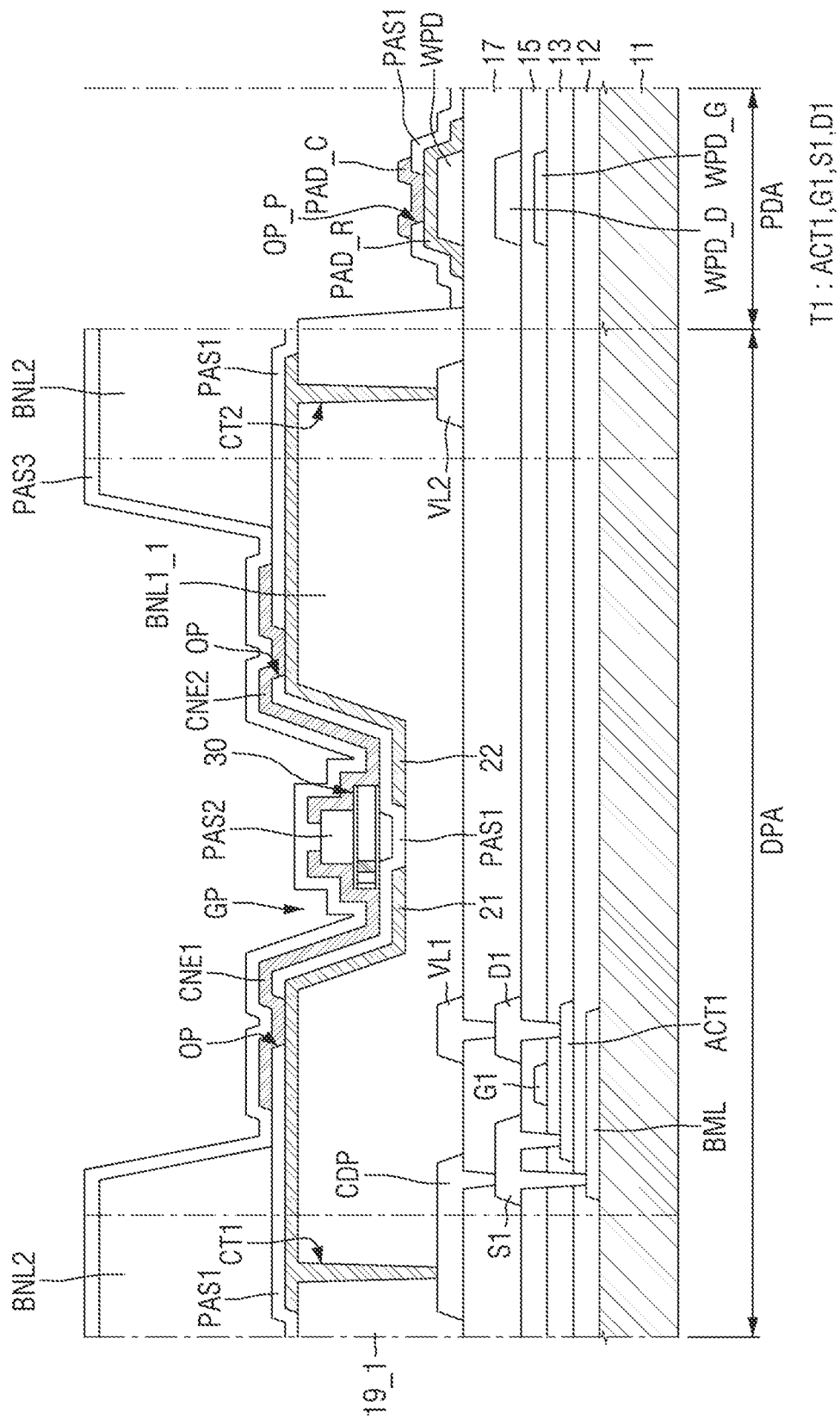
FIG. 20 is a cross-sectional view illustrating a display area and a pad area of a display device according to other embodiments of the present disclosure.

FIG. 20 is a cross-sectional view illustrating a display area and a pad area of a display device according to other embodiments of the present disclosure.

Referring to FIG. 20, a first planarization layer 19_1 and first banks BNL1_1 may be integrally formed at the same time by a single process. The first planarization layer 19_1 and the first banks BNL1_1 may be formed as a single layer having different heights by a patterning process using a halftone mask or a slit mask. In some embodiments, part of the first planarization layer 19_1 where a groove part GP is formed may be located on a second data conductive layer, and parts of the first planarization layer 19_1 that have an elevated top surface due to the absence of the groove part GP may be the first banks BNL1_1. The example shown in FIG. 20 differs from other embodiments in that the first planarization layer 19_1 and the first banks BNL1_1 are integrally formed.

The first banks BNL1_1 may be formed to have a greater thickness than the part of the first planarization layer 191 where the groove part GP is formed, and may planarize a height difference formed by a circuit layer or a first transistor T1 located therebelow. In some embodiments, the first banks BNL1_1 may be formed to have a flat top surface, to overlap with the first transistor T1 in a thickness direction, and to have inclined sides where the groove part GP is formed. At least one light-emitting element 30, parts of electrodes 21, 22, and a second insulating layer PAS2 may be located in the groove part GP. According to the example shown in FIG. 20, because the first planarization layer 19_1 and the first banks BNL1_1 include substantially the same material and can be formed by a single process, the number of processes for forming a display device can be further reduced.

Figure 21:
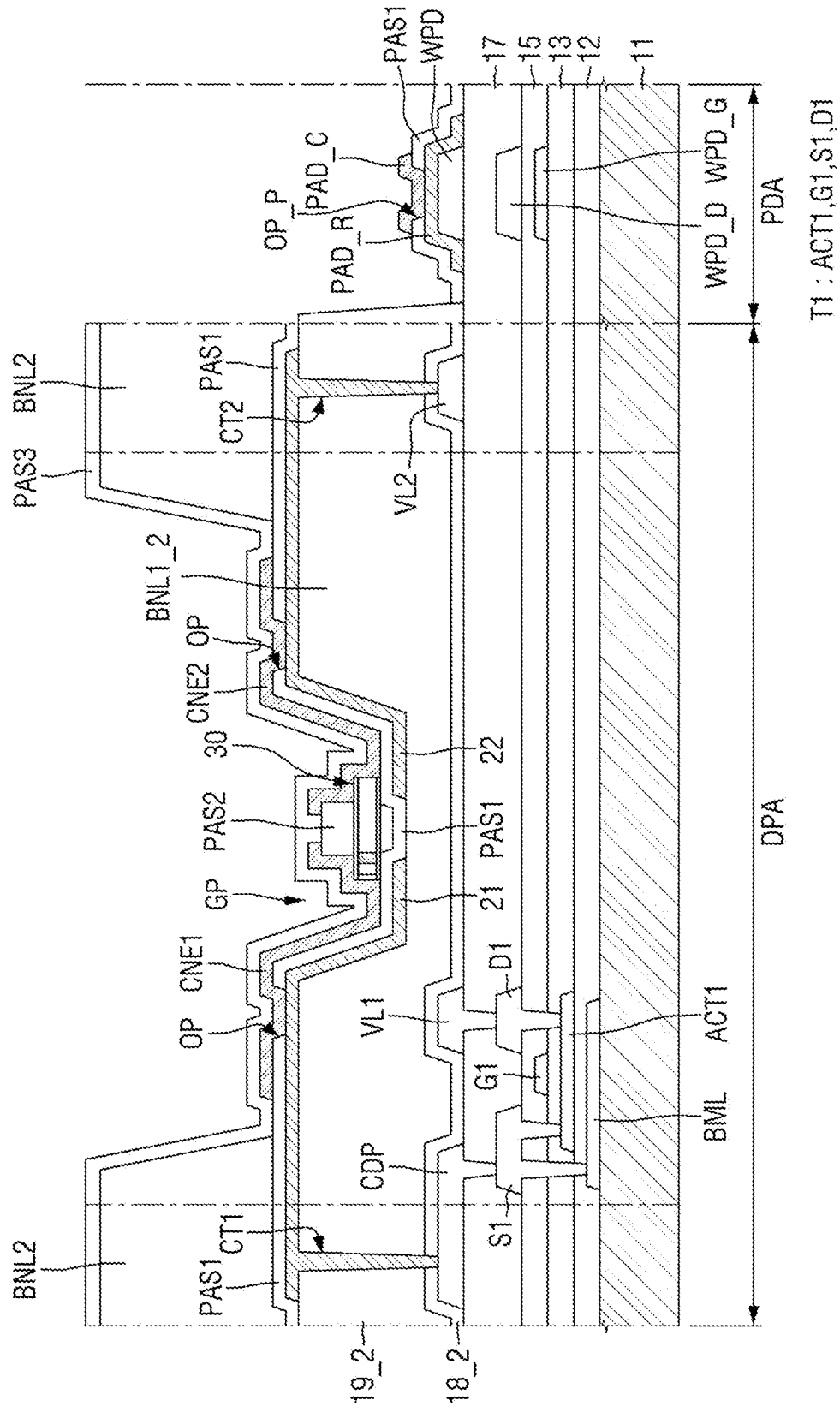
FIG. 21 is a cross-sectional view illustrating a display area and a pad area of a display device according to other embodiments of the present disclosure.
Figure 22:
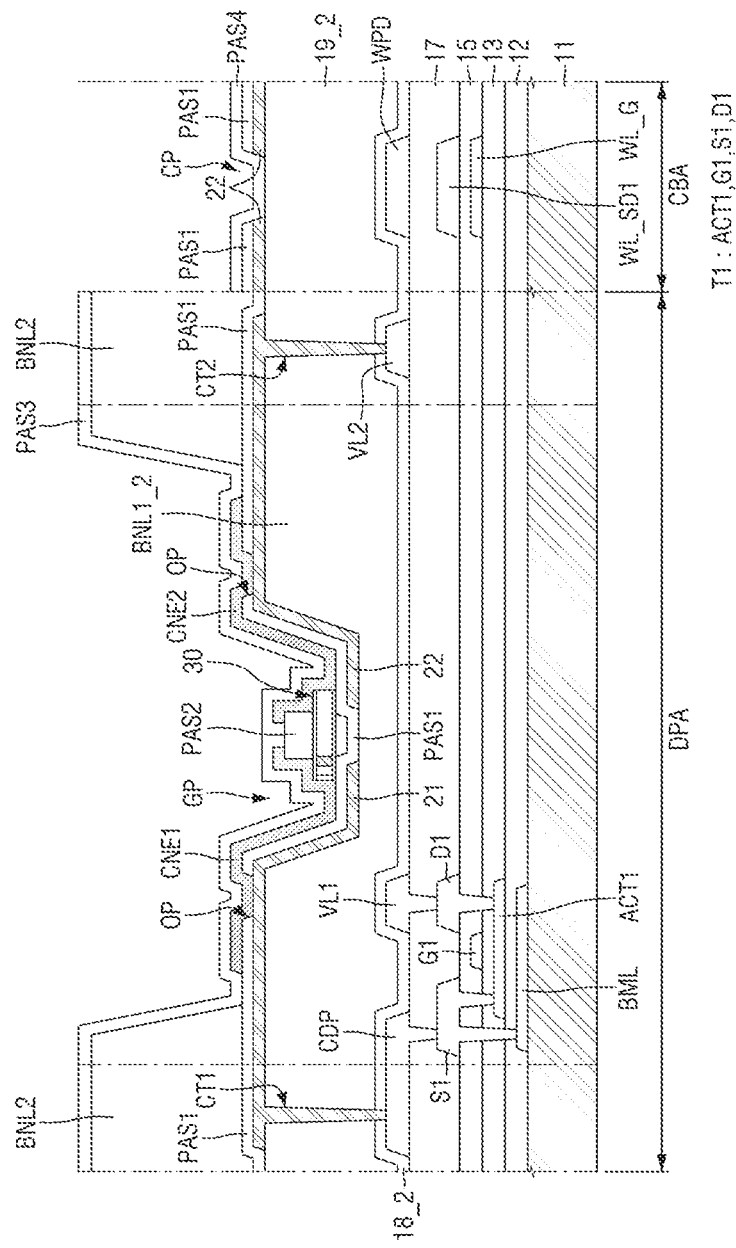
FIG. 22 is a partial cross-sectional view of a subpixel of the display device of FIG. 21.

FIG. 21 is a cross-sectional view illustrating a display area and a pad area of a display device according to other embodiments of the present disclosure, and FIG. 22 is a partial cross-sectional view of a subpixel of the display device of FIG. 21.

Referring to FIGS. 21 and 22, a display device 10 may further include a third interlayer insulating layer 182, which is located between a second data conductive layer and first banks BNL1_2, or between the second data conductive layer and a first planarization layer 19_2. The third interlayer insulating layer 182 may be located on the entire surface of a second interlayer insulating layer 17, on which the second data conductive layer is located, to cover the entire second data conductive layer, except for part of the second data conductive layer in a pad area PDA. The third interlayer insulating layer 18_2 may reduce or prevent the likelihood of the second data conductive layer being damaged in the process of applying an organic material and subjecting the organic material to exposure and development to form the first planarization layer 19_2 and the first banks BNL1_2. The embodiments corresponding to FIGS. 21 and 22 differs from the previous embodiments in that the third interlayer insulating layer 18_2 is further provided.

Because the third interlayer insulating layer 182 is further located, the second data conductive layer can be further protected. Also, because the first banks BNL1_2 can be formed to have a given height and to have a flat top surface, the first planarization layer 19_2 can be omitted.

Figure 23:
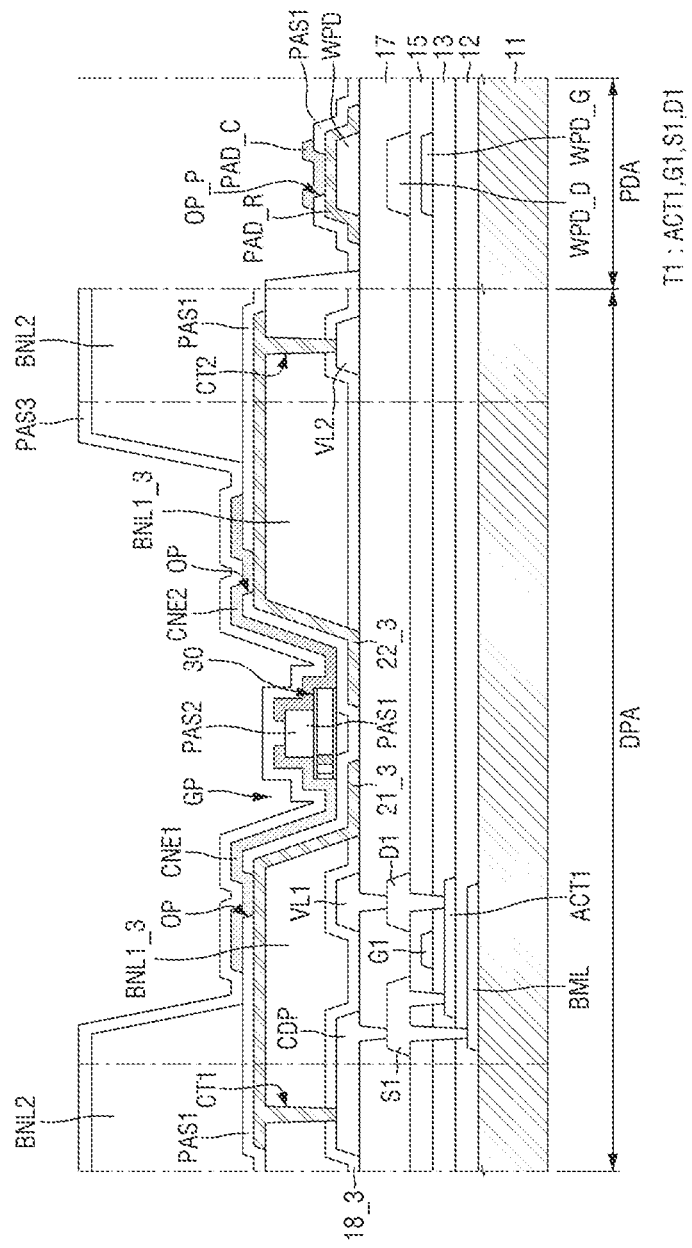
FIG. 23 is a cross-sectional view illustrating a display area and a pad area of a display device according to other embodiments of the present disclosure.

FIG. 23 is a cross-sectional view illustrating a display area and a pad area of a display device according to other embodiments of the present disclosure.

Referring to FIG. 23, a first planarization layer 19 may be omitted, and first banks BNL1_3 may be located directly on a third interlayer insulating layer 18_3. Part of the third interlayer insulating layer 18_3 between the first banks BNL1_3 may be removed in a mask process for forming the first banks BNL1_3 so that a second interlayer insulating layer 17 may be exposed, and at least one light-emitting element 30 may be located in a groove part GP where the second interlayer insulating layer 17 is exposed.

The first banks BNL1_3 may be located directly on the third interlayer insulating layer 18_3. The first banks BNL1_3 may be located to overlap with a circuit layer (e.g., a first transistor T1, a first conductive pattern CDP, and voltage lines VL1, VL2) located therebelow in a thickness direction. The first banks BNL1_3 may include an organic material and thus may be formed to have a given height and a flat top surface. A height difference formed by the circuit layer below the third interlayer insulating layer 18_3 may be planarized by the first banks BNL1_3.

The first banks BNL1_3 may be spaced apart from each other in an area where wires of the circuit layer are omitted, and as a result, the groove part GP may be formed. The groove part GP may be formed, during the formation of the first banks BNL1_3, by depositing an organic material layer on the third interlayer insulating layer 18_3 and removing part of the organic material layer. In some embodiments, during the formation of the first banks BNL1_3, part of the third interlayer insulating layer 18_3 may be removed in an area where the groove part GP is formed, and as a result, the second interlayer insulating layer 17 may be exposed. The first banks BNL1_3 may be formed to have a flat top surface, but also to have inclined sides, and inner sides of the third interlayer insulating layer 18_3 may be aligned with the sides of the first banks BNL1_3. During the formation of the first banks BNL1_3, the third interlayer insulating layer 18_3 may be partially removed using the first banks BNL1_3 as a mask. Parts of first and second electrodes 21 and 22, which are located on the first banks BNL1_3, may be located directly on the second interlayer insulating layer 17, in the groove part GP. A first insulating layer PAS1, the light-emitting element 30, and a second insulating layer PAS2 may also be located in the groove part GP.

The third interlayer insulating layer 183 may be omitted from a pad area PDA, and the pad area PDA may have the same structure as its counterparts in the previous embodiments. In some embodiments, parts of electrodes 21, 22 in a display area DPA may be located directly on the second interlayer insulating layer 17, between the first banks BNL1_3, and may be arranged on the same layer as a pad electrode base layer PAD_R in the pad area PDA. Because a display device 10 of FIG. 23 includes the third interlayer insulating layer 18_3, a first planarization layer 19 can be omitted, and a height difference formed by a first transistor T1 of a circuit layer can be substantially planarized by the first banks BNL1_3. Because the third interlayer insulating layer 18_3 is provided, some processes of the fabrication of the display device 10 can be omitted, and parts of layers including the same material can be arranged on the same layer.

The fabrication of each display device 10 includes generating a light-emitting element alignment signal, which is an electrical signal for aligning light-emitting elements 30. During the alignment of light-emitting elements 30 in each subpixel PXn, signals may be applied in a state where electrodes 21, 22 of each subpixel PXn are being connected. A plurality of display devices 10 may be formed on a single base substrate, and the light-emitting element alignment signal may be applied to the plurality of display devices 10 via the same pads. The pads formed on the base substrate may be located on the same layer as the circuit layers of the plurality of display devices 10, and each of the plurality of display devices 10 may be obtained by cutting the base substrate. Wire pads WPD in the pad area PDA of each of the plurality of display devices 10 may have a similar structure to the pads formed on the base substrate.

Figure 24:
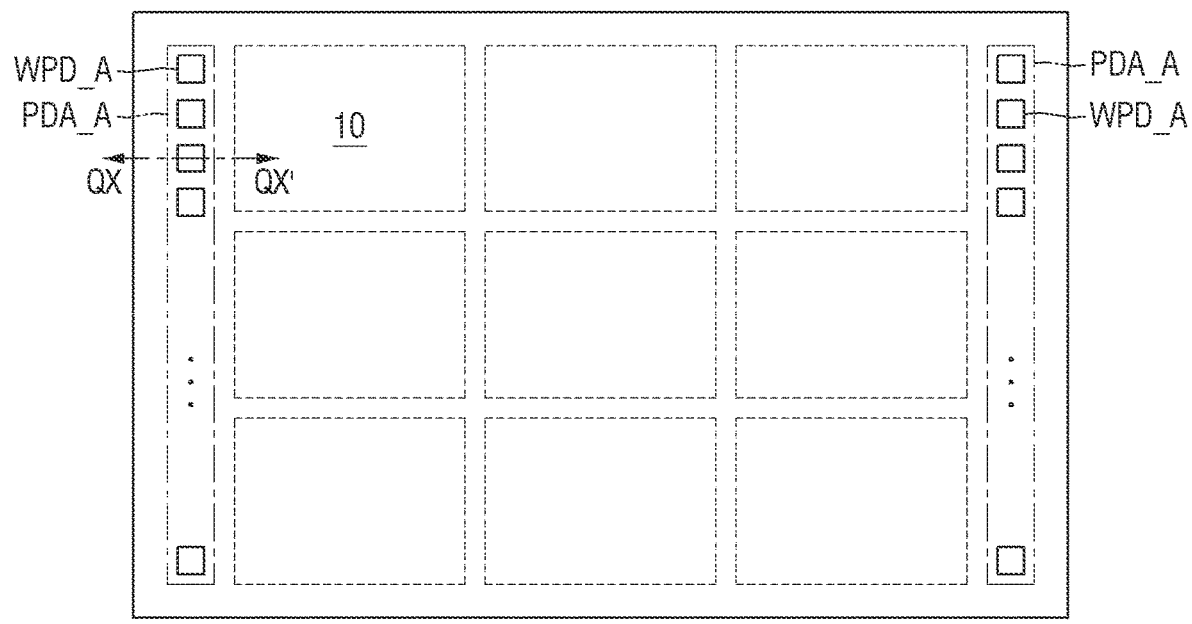
FIG. 24 is a plan view illustrating a substrate on which a plurality of display devices are formed in accordance with the method of FIGS. 8 through 19.

FIG. 24 is a plan view illustrating a substrate on which a plurality of display devices are formed in accordance with the method of FIGS. 8 through 19, and FIG. 25 is a cross-sectional view taken along the line QX-QX' of FIG. 24. For example, FIG. 24 illustrates the layout of a base substrate 1 where a plurality of display devices 10 are formed, and FIG. 25 is a cross-sectional view illustrating one alignment pad area PDA_A of the base substrate 1 and part of an edge of one display device on the base substrate 1.

Figure 25:
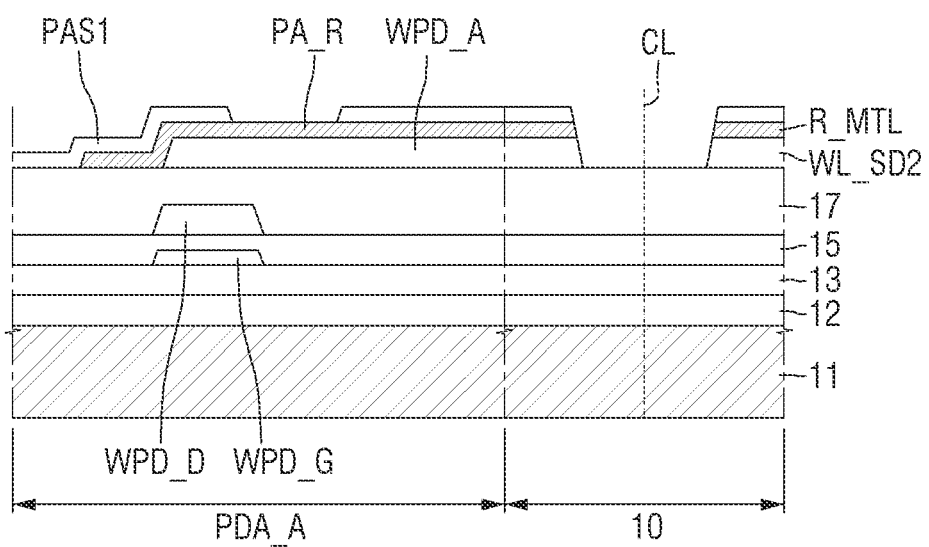
FIG. 25 is a cross-sectional view taken along the line QX-QX' of FIG. 24.

Referring to FIGS. 24 and 25, a plurality of display devices 10 may be formed on the base substrate 1, which includes a plurality of alignment pad areas PDA_A. The base substrate 1 may include a plurality of areas, and in each of the areas, layers such as a circuit layer and a display element layer are formed to form each display device 10. That is, the fabrication of each display device 10 may be performed on the base substrate 1 of FIG. 24, and each of the areas of the base substrate 1 may be cut off or separated to form each display device 10.

The base substrate 1 may include areas in which display devices 10 are to be formed and a plurality of alignment pad areas PDA_A, which are located on the periphery of the areas in which display devices 10 are to be formed. In the alignment pad areas PDA_A, alignment pads WPD_A, which are for applying electrical signals to electrodes 21, 22 during the fabrication of display devices 10, may be located. Devices for applying a light-emitting element alignment signal may be connected on the alignment pads WPD_A. During the fabrication of display devices 10, the light-emitting element alignment signal may be applied to the areas in which display devices 10 are to be formed, via wires connected to the alignment pads WPD_A.

In some embodiments, the alignment pads WPD_A of the base substrate 1 where display devices 10 are formed may have a similar structure to wire pads WPD of each of the display devices 10. That is, referring to FIG. 25, in a cross-sectional view, each alignment pad area PDA_A of the base substrate 1 may include a buffer layer 12, a gate insulating layer (e.g., a first gate insulating layer) 13, a gate pad WPD_G, a first interlayer insulating layer 15, a data pad WPD_D, and a second interlayer insulating layer 17, and an alignment pad WPD_A may be located on the second interlayer insulating layer 17. An alignment pad electrode PA_R, which is formed by the same process as electrodes 21, 22 of each display device 10, may be located on the alignment pad WPD_A, and a first insulating layer PAS1 may be located on the alignment pad electrode PA_R.

However, because no electrical signals are applied after the alignment of light-emitting elements 30 on electrodes 21, 22, layers formed in subsequent processes may not be located on the alignment pad WPD_A. For example, contact electrodes CNE1, CNE2 or an electrode that includes the same material as a pad electrode upper layer PAD_C may not be located on the alignment pad electrode PA_R. Each device for applying the light-emitting element alignment signal may be electrically connected to the alignment pad electrode PA_R via a conductive ball. The alignment pad WPD_A may transmit electrical signals applied via the alignment pad electrode PA_R to an area in which each display device 10 is to be formed. Pads located in the alignment pad area PDA_A, for example, the gate pad WPD_G and the data pad WPD_D, may be electrically connected to the alignment pad WPD_A, a gate pad WPD_G, and a data pad WPD_D of each display device 10. The light-emitting element alignment signal may be applied to the alignment pad WPD_A and may then be transmitted to each display device 10.

The alignment pad electrode PA_R may be formed by the same process as the electrodes 21, 22, and during the fabrication of each display device 10, the electrodes 21, 22 may be formed to be connected, regardless of other subpixels PXn or other display devices 10. The alignment pad electrode PA_R may be connected directly to the electrodes 21, 22. The light-emitting element alignment signal may be transmitted directly to the electrodes 21, 22 via the alignment pad electrode PA_R.

Once the fabrication of each display device 10 is complete, each display device 10 may be cut off or separated from the base substrate 1. The area in which each display device 10 is formed may be cut off along a cutting line CL of the base substrate 1. Wires R_MTL, WL_SD2 that are previously connected to, but separated later from, the alignment pad WPD_A and the alignment pad electrode PA_R may remain near the cutting line CL of the base substrate 1. For example, a pad wire WL_SD2 that is previously connected directly to, but later separated from, the alignment pad WPD_A and an electrode wire R_MTL that is previously connected directly to, but later separated from, the alignment pad electrode PA_R may remain near the cutting line CL. Once the fabrication of each display device 10, which is performed on each of the areas of the base substrate 1, is complete, the disconnecting of the alignment pad WPD_A and the alignment pad electrode PA_R near the cutting line CL may be performed so that the pad wire WL_SD2 and the electrode wire R_MTL may remain in the area in which each display device 10 is formed. Thereafter, each display device 10 may be obtained by cutting the base substrate 1 along the cutting line CL. Each display device 10 may include the pad wire WL_SD2 and the electrode wire R_MTL, which remain on an edge of a non-display area NDA, and the pad wire WL_SD2 and the electrode wire R_MTL may be connected to some wires located in a display area DPA. The pad wire WL_SD2 and the electrode wire R_MTL may be evidence that electrical signals have been applied via the alignment pad WPD_A during the fabrication of each display device 10.

First and second electrodes 21 and 22 might not necessarily extend in one direction. In some embodiments, the electrodes 21, 22 may include portions that extend in one direction and have different widths and portions that extend in another direction.

Figure 26:
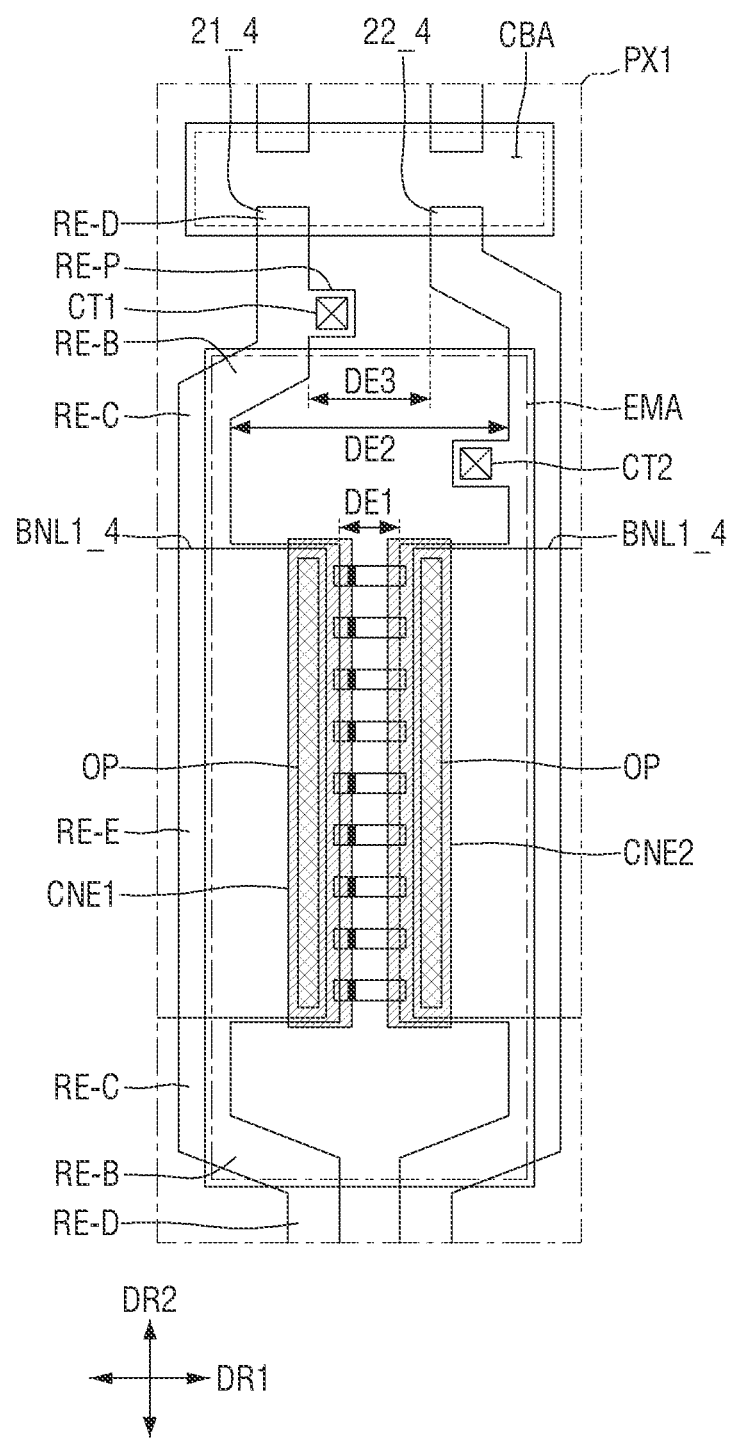
FIG. 26 is a plan view of a subpixel of a display device according to other embodiments of the present disclosure.

FIG. 26 is a plan view of a subpixel of a display device according to other embodiments of the present disclosure.

Referring to FIG. 26, each of electrodes 214, 22_4 may include an extension portion RE-E, which generally extends in a second direction and has a greater width than the rest of the corresponding electrode, bent portions RE-B, which extend in a diagonal direction with respect to a first direction DR1 or the second direction DR2, and connecting portions RE-C, which connect the bent portions RE-B and the extension portion RE-E. The electrodes 21_4, 22_4 may generally extend in the second direction DR2, but may have a relatively large width in part, or may be bent in a diagonal direction with respect to the second direction DR2. First and second electrodes 21_4 and 22_4 may be arranged symmetrically with respect to the gap therebetween. The shape of the electrodes 21_4, 22_4 will hereinafter be described, taking the first electrode 21_4 as an example.

The first electrode 21_4 may include an extension portion RE-E, which has a greater width than the rest of the first electrode 21_4. Extension portions RE-E of the electrodes 214, 22_4 may be located on first banks BNL1_4 in an emission area EMA of a subpixel PXn, and may extend in the second direction DR2. Light-emitting elements 30 may be located on the extension portions RE-E. Contact electrodes CNE1, CNE2 may be located on the extension portions RE-E, but may have a smaller width than the extension portions RE-E. The contact electrodes CNE1, CNE2 may be located to cover openings OP, which expose parts of the top surfaces of the extension portions RE-E, and thus to be in contact with the extension portions RE-E.

Connecting portions RE-C of each of the electrodes 21_4, 22_4 may be connected to both sides of the extension portion RE-E of the corresponding electrode with respect to the second direction DR2. The connecting portions RE-C of each of the electrodes 214, 22_4 may be connected to the extension portions RE-E of the corresponding electrode, and may be located in and across the emission area EMA and a second bank BNL2.

The connecting portions RE-C of each of the electrodes 21_4, 22_4 may have a smaller width than the extension portion RE-E of the corresponding electrode. First sides of the connecting portions RE-C of each of the electrodes 214, 22_4 that extend in the second direction DR2 may be connected to a first side of the extension portion RE-E of the corresponding electrode that extends in the second direction DR2, on the same line. For example, an outer side of the extension portion RE-E of each of the electrodes 21_4, 22_4 may extend to be connected to outer sides of the connecting portions RE-C of the corresponding electrode. Accordingly, a distance DE1 between the extension portions RE-E of the first and second electrodes 21_4 and 22_4 may be smaller than a distance DE2 between upper (or lower) connecting portions RE-C of the first and second electrodes 21_4 and 22_4.

Bent portions RE-B are connected to connecting portions RE-C. The bent portions RE-B may be connected to the connecting portions RE-C and may be bent in a diagonal direction with respect to the second direction DR2, for example, in a direction toward the center of each subpixel PXn. A minimum distance DE3 between the bent portions RE-B may be smaller than the distance DE2 between the connecting portions RE-C, but may be greater than the distance DE1 between the extension portions RE-E.

The length of an upper connecting portion RE-C of the first electrode 21_4, which is connected to the upper side of the extension portion RE-E of the first electrode 21_4, may be smaller than the length of an upper connecting portion RE-C of the second electrode 22_4, which is connected to the upper side of the extension portion RE-E of the second electrode 22_4. Accordingly, upper bent portions RE-B of the first and second electrodes 21_4 and 22_4 may be arranged in a staggered manner. On the contrary, lower connecting portions of the electrodes 21_4, 22_4, which are connected to the lower sides of the extension portions RE-E of the electrodes 21_4, 22_4, may have the same length, and lower bent portions RE-B of the electrodes 21_4, 22_4 may be arranged symmetrically with each other.

Fragment portions RE-D, which are obtained when the electrodes 21_4, 22_4 are separated into pieces in a cut area CBA, may be formed at first ends of the upper bent portions RE-B. The fragment portions RE-D may be parts of electrodes 214, 22_4 of a neighboring subpixel PXn in the second direction DR2 that remain in the cut area CBA.

The first electrode 21_4 may further include a contact portion RE-P, which is located between the upper bent portion RE-B and the fragment portion RE-D of the first electrode 21_4 and has a relatively large width. A contact portion RE-P of the second electrode 22_4 may be formed in the upper connecting portion RE-C of the second electrode 22_4. First and second contact holes CT1 and CT2 of the first and second electrodes 21_4 and 22_4 may be formed in the contact portions RE-P of the first and second electrodes 21_4 and 22_4.

The embodiments corresponding to FIG. 26 differs from the embodiments corresponding to FIG. 4 in that each of the first and second electrodes 21_4 and 22_4 includes an extension portions RE-E, connecting portions RE-C, and bent portions RE-B. However, the present disclosure is not limited thereto. Alternatively, the first and second electrodes 21_4 and 224 may have different shapes.

In concluding the detailed description, those skilled in the art will appreciate that many variations and modifications can be made to the described embodiments without substantially departing from aspects of the present disclosure. Therefore, the disclosed embodiments are used in a generic and descriptive sense only and not for purposes of limitation.

What is claimed is:

1. A display device comprising:
   a first substrate comprising a display area and a pad area;
   a wire pad on the first substrate in the pad area;
   electrodes on the display area and spaced from each other;
   a pad electrode base layer directly on the wire pad, having a greater width than the wire pad, and covering sides of the wire pad;
   light-emitting elements on the electrodes in the display area; and
   a pad electrode upper layer in the pad area and contacting the pad electrode base layer,
   wherein the pad electrode base layer comprises a same material as the electrodes.

2. The display device of claim 1, further comprising: a first insulating layer on at least portion of the electrodes and at least a portion of the pad electrode base layer,
   wherein the first insulating layer has a pad opening exposing a part of a top surface of the pad electrode base layer, and
   wherein the pad electrode upper layer contacts the exposed part of the top surface of the pad electrode base layer through the pad opening.

3. The display device of claim 2, wherein the pad electrode base layer comprises an alloy of aluminum, and
   wherein the pad electrode upper layer comprises ITO, IZO, or ITZO.

4. The display device of claim 2, wherein the pad electrode base layer is at a same layer as the wire pad.

5. The display device of claim 4, wherein the first insulating layer has a greater width than the pad electrode base layer, and is partially at the same layer as the pad electrode base layer and the wire pad, in the pad area.

6. The display device of claim 2, further comprising:
   a first interlayer insulating layer on the first substrate;
   a first data conductive layer on the first interlayer insulating layer, and comprising source and drain electrodes;
   a second interlayer insulating layer on the first data conductive layer; and
   a second data conductive layer on the first interlayer insulating layer and comprising voltage lines,
   wherein the wire pad is directly on the second interlayer insulating layer.

7. The display device of claim 6, further comprising a third interlayer insulating layer on the second data conductive layer and excluded from the pad area,
   wherein the first insulating layer is on the third interlayer insulating layer in the display area.

8. The display device of claim 7, wherein at least a part of the electrodes is directly on the third interlayer insulating layer.

9. The display device of claim 7, further comprising a bank located on the third interlayer insulating layer, and surrounding an area in which the light-emitting elements are located.

10. The display device of claim 1, further comprising upper electrodes on the light-emitting elements, and
    wherein the pad electrode upper layer comprises the same material as the upper electrodes.

11. A display device comprising:
    a first substrate comprising a display area and a pad area;
    a data conductive layer on the first substrate and comprising power supply lines in the display area and a wire pad in the pad area;
    electrodes on the data conductive layer in the display area;
    a pad electrode base layer in the pad area to cover and completely overlap the wire pad;
    light-emitting elements on the electrodes; and
    a pad electrode upper layer in the pad area, and contacting the pad electrode base layer.

12. The display device of claim 11, wherein the electrodes and the pad electrode base layer comprise a same material.

13. The display device of claim 12, further comprising a first insulating layer on the electrodes and the pad electrode base layer, the first insulating layer having openings,
    wherein the pad electrode base layer has a greater width than the wire pad, and
    the first insulating layer and the pad electrode base layer are partially at a same layer as the wire pad in the pad area.

14. The display device of claim 11, further comprising:
    a first interlayer insulating layer on the first substrate and contacting the data conductive layer; and
    a second interlayer insulating layer on the data conductive layer,
    wherein the wire pad is directly on the first interlayer insulating layer.

15. The display device of claim 14, wherein the second interlayer insulating layer exposes a part of the first interlayer insulating layer, and
    wherein parts of the electrodes are directly on the second interlayer insulating layer.

* * * * *